United States Patent
Baselmans

(10) Patent No.: US 10,845,712 B2
(45) Date of Patent: Nov. 24, 2020

(54) OPTICAL SYSTEM AND METHOD

(71) Applicant: ASML NETHERLANDS B.V., Veldhoven (NL)

(72) Inventor: Johannes Jacobus Matheus Baselmans, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/576,299

(22) Filed: Sep. 19, 2019

(65) Prior Publication Data
US 2020/0012199 A1 Jan. 9, 2020

Related U.S. Application Data

(62) Division of application No. 16/060,195, filed as application No. PCT/EP2016/079396 on Dec. 1, 2016, now Pat. No. 10,444,637.

(30) Foreign Application Priority Data

Dec. 18, 2015 (EP) .................. EP15201057

(51) Int. Cl.
*G03F 7/20* (2006.01)
*G02B 27/48* (2006.01)

(52) U.S. Cl.
CPC ......... *G03F 7/70583* (2013.01); *G02B 27/48* (2013.01); *G03F 7/70025* (2013.01);
(Continued)

(58) Field of Classification Search
CPC . G02B 27/48; G03F 7/70025; G03F 7/70041; G03F 7/70133; G03F 7/70558;
(Continued)

(56) References Cited

U.S. PATENT DOCUMENTS

2002/0062204 A1* 5/2002 Nakajima ............. G03F 9/7088
   702/150
2005/0207673 A1* 9/2005 Takane .................. G01B 15/04
   382/286
(Continued)

FOREIGN PATENT DOCUMENTS

JP    S60136312 A    7/1985
JP    H11135426 A    5/1999
(Continued)

OTHER PUBLICATIONS

PCT/EP2016/079396 International Search Report dated Mar. 16, 2017.
(Continued)

*Primary Examiner* — Colin W Kreutzer
(74) *Attorney, Agent, or Firm* — Pillsbury Winthrop Shaw Pittman LLP

(57) ABSTRACT

An optical system comprising: an illumination system configured, to form a periodic illumination mode comprising radiation in a pupil plane of the optical system having a spatial intensity profile which is periodic in at least one direction, a measurement system configured to measure a dose of radiation which is received in an field plane of the optical system as a function of position in the field plane, and a controller configured to: select one or more spatial frequencies in the field plane at which variation in the received dose of radiation as a function of position is caused by speckle, and determine a measure of the variation of the received dose of radiation as a function of position at the selected one or more spatial frequencies, the measure of the variation in the received dose being indicative of speckle in the field plane.

21 Claims, 13 Drawing Sheets

(52) U.S. Cl.
CPC ........ *G03F 7/70041* (2013.01); *G03F 7/7085* (2013.01); *G03F 7/70558* (2013.01); *G03F 7/70575* (2013.01); *G03F 7/70625* (2013.01)

(58) Field of Classification Search
CPC ............. G03F 7/70575; G03F 7/70583; G03F 7/70625; G03F 7/7085
USPC ............................................. 355/67, 68, 77
See application file for complete search history.

(56) References Cited

U.S. PATENT DOCUMENTS

| | | | |
|---|---|---|---|
| 2008/0165337 A1 | 7/2008 | Ershov et al. | |
| 2009/0176167 A1* | 7/2009 | Hulsebos | G03F 9/7049 430/22 |
| 2010/0079738 A1 | 4/2010 | Eisenmenger et al. | |
| 2011/0216390 A1 | 9/2011 | Tong et al. | |
| 2011/0304837 A1 | 12/2011 | Patra | |
| 2013/0326439 A1* | 12/2013 | Matsuoka | G06F 30/00 716/55 |

FOREIGN PATENT DOCUMENTS

| | | |
|---|---|---|
| JP | 2007024896 A | 2/2007 |
| JP | 2007525826 A | 9/2007 |
| JP | 2007333745 A | 12/2007 |
| JP | 2008522421 A | 6/2008 |
| JP | 2009257937 A | 11/2009 |
| JP | 2012073612 A | 4/2012 |
| JP | 2012518286 A | 8/2012 |
| JP | 2017090568 A | 5/2017 |
| WO | 2015107976 A1 | 7/2015 |

OTHER PUBLICATIONS

Noordman et al: "Speckle in optical lithography and the influence on line width roughness", SPIE—International Society for Optical Engineering Proceedings, vol. 7274, Mar. 13, 2009.

Rydberg et al. "Dynamic laser speckle as a detrimental phenomenon in optical projection lithography" J. Microlith., Microfab., Microsyst. 5(3), 033004 (Jul.-Sep. 2006).

Mazhar et al. "Laser speckle imaging in the spatial frequency domain" Biomedical Optics Express 1553, Jun. 1, 2011 / vol. 2, No. 6.

Office Action issued in Japanese Patent Application No. 2018-532108 dated Jun. 18, 2019, 10 pages (English language translation attached).

* cited by examiner

OPTICAL SYSTEM AND METHOD

CROSS-REFERENCE TO RELATED APPLICATIONS

This application is a divisional of U.S. application Ser. No. 16/060,195, filed Jun. 7, 2018 which is a U.S. National Stage Application of PCT/EP2016/079396 filed on Dec. 1, 2016 which claims priority to EP application 15201057.5, filed on Dec. 18, 2015, the entire contents of each of which is incorporated herein by reference.

FIELD

The present invention relates to an optical system and methods of performing measurements. The optical system may particularly, but not exclusively, form part of a lithographic apparatus.

BACKGROUND

A lithographic apparatus is a machine that applies a desired pattern onto a target portion of a substrate. A lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

It may be desirable to measure one or more properties of radiation which propagates through a lithographic apparatus. It is desirable to provide, apparatus and methods which obviate or mitigate one or more of the problems of the prior art, whether identified herein or elsewhere.

SUMMARY

According to a first aspect of the invention, there is provided An optical system comprising: an illumination system configured, to form a periodic illumination mode comprising radiation in a pupil plane of the optical system having a spatial intensity profile which is periodic in at least one direction; a measurement system configured to measure a dose of radiation which is received in an field plane of the optical system as a function of position in the field plane; and a controller configured to: select one or more spatial frequencies in the field plane at which variation in the received dose of radiation as a function of position is caused by speckle; and determine a measure of the variation of the received dose of radiation as a function of position at the selected one or more spatial frequencies, the measure of the variation in the received dose being indicative of speckle in the field plane.

The periodic illumination mode formed by the illumination system serves to confine the effects of speckle to a limited number of spatial frequencies in the field plane of the optical system. A variation in the dose of radiation received in the field plane may be analysed at one or more spatial frequencies in the field plane at which variation in the received dose of radiation as a function of position is caused by speckle. This may for example, correspond with a position in an autocorrelation function at which a local maximum is caused by speckle. Confining the effects of speckle to limited spatial frequencies advantageously allows the contribution of speckle to a dose variation in the field plane to be separated from the contribution of other effects.

A field plane may be an image plane or an object plane of the optical system. A pupil plane of an optical system is a plane which has a Fourier relationship with a field plane. That is, each spatial point in a pupil plane corresponds with an angle in a corresponding field plane and vice versa.

The illumination system may be configured to illuminate a patterning device with a radiation beam, the patterning device being configured to impart the radiation beam with a pattern in its cross-section so as to form a patterned radiation beam.

The optical system may further comprise a projection system configured to project a radiation beam onto an field plane.

The radiation beam which is projected onto the field plane may, for example, be a patterned radiation beam which is patterned by the patterning device.

The controller may be further configured to determine the contribution of speckle to the variation in the received dose, the contribution of speckle being determined using the measure of the variation of the received dose at the selected one or more spatial frequencies.

The determined contribution of speckle to the variation in the received dose may comprise a variance of the dose which is caused by speckle.

The controller may be configured to determine, from the measure of the variation of the received dose at the selected one or more spatial frequencies, a number of independent speckle patterns which are received in the field plane in a given period of time.

The measurement system may comprise a substrate table configured to hold a substrate substantially in the field plane so as to expose the substrate to the patterned radiation beam; and a sensor configured to detect a dimension of a feature patterned into the substrate at different positions on the substrate, the dimension of the feature patterned into the substrate as a function of position on the substrate providing a measure of the dose of radiation received in the field plane as a function of position in the field plane.

The sensor may comprise a scanning electron microscope configured to take an image of the feature patterned onto the substrate and a controller configured to detect, from the image, a dimension of the feature at different positions on the substrate.

The measurement system may further comprise a track configured to apply a resist to a substrate and develop the resist after exposure to a patterned radiation beam so as to transfer the pattern to the substrate.

The controller may be configured to determine an autocorrelation function of a first series and a second series, wherein the first series comprises the measured received dose of radiation in the field plane at different positions in the field plane and the second series is the same as the first series and offset from the first series by a positional offset.

The controller may be configured to evaluate the autocorrelation function at a positional offset which is the inverse of the one or more selected spatial frequencies.

The positional offset which is the inverse of the one or more selected spatial frequencies may represent a positional offset at which the autocorrelation function is substantially at a local maximum.

The autocorrelation function evaluated at a positional offset which is the inverse of the one or more selected spatial frequencies may provide a measure of the contribution of speckle to a variation in the received dose of radiation as a function of the position in the field plane.

The controller may be further configured to scale the autocorrelation function evaluated at a positional offset which is the inverse of the one or more selected spatial frequencies and determine the total variance in the received dose of radiation in the field plane which is caused by speckle.

The controller may be further configured to: determine a ratio of a local maximum to a global maximum in a speckle autocorrelation function which corresponds to a variation in dose in the field plane which is only caused by speckle; and scale the autocorrelation function evaluated at a positional offset which is the inverse of the one or more selected spatial frequencies according to the determined ratio.

The optical system may further comprise a sensor apparatus configured to measure the spatial intensity profile of the periodic illumination mode in the pupil plane of the optical system, wherein the controller is configured to determine, from the measured spatial intensity profile of the periodic illumination mode, the ratio of a local maximum to a global maximum in a speckle autocorrelation function, wherein the speckle autocorrelation function corresponds to a variation in dose in the field plane which is only caused by speckle.

The controller may be configured to perform a simulation of radiation propagating through the optical system and determine, from the simulation, the ratio of a local maximum to a global maximum in a speckle autocorrelation function which corresponds to a variation in dose in the field plane which is only caused by speckle.

The optical system may further comprise a radiation source configured to provide a radiation beam to the illumination system, wherein the radiation source is operable to adjust a property of the radiation beam so as to change a number of independent speckle patterns which are received in the field plane per unit time.

The radiation source may be configured to provide a pulsed radiation beam to the illumination system and wherein the radiation source is operable to adjust the duration of pulses of radiation which are emitted from the radiation source, thereby changing the number of independent speckle patterns which are received in the field plane per unit time.

For each configuration of the adjustable property of the radiation source, the controller is configured to: select one or more spatial frequencies in the field plane at which variation in the received dose of radiation as a function of position is caused by speckle; and determine a measure of the variation of the received dose of radiation as a function of position at the selected one or more spatial frequencies, the measure of the variation in the received dose being indicative of speckle in the field plane.

The controller may be further configured to evaluate the measure of the variation in the received dose at a plurality of configurations of the adjustable property of the radiation source, and from the evaluation determine the contribution of speckle to the variation of the received dose at each configuration.

The controller may be configured to select the one or more spatial frequencies in the field plane at which the variation in the measured dimension is caused by speckle, using the number of periods of the spatial intensity distribution in the pupil plane of the optical system.

The controller may be configured to select the one or more spatial frequencies in the field plane at which the variation in the measured dimension is caused by speckle by calculating a spatial period $P_s$ according to:

$$P_S = \frac{\lambda K}{2NA}$$

where K is the number of periods of the spatial intensity distribution in the pupil plane of the optical system, $\lambda$ is the wavelength of the radiation beam and NA is the numerical aperture of the optical system, wherein the one or more spatial frequencies in the field plane at which the variation in the measured dimension is caused by speckle is the inverse of the spatial period $P_s$.

The illumination system may comprise an array of mirrors, the mirrors being adjustable so as to adjust the spatial intensity profile in the pupil plane of the optical system.

The illumination system may be configured to form a periodic illumination mode comprising radiation in a pupil plane of the optical system having a periodic spatial intensity profile in a first direction, wherein the periodic spatial intensity profile includes K periods.

The illumination system may be configured such that the spatial intensity profile substantially follows a Gaussian distribution in a second direction, wherein the second direction is substantially perpendicular to the first direction.

K may be an integer.

K may be an odd number.

K may be 5 or more.

K may be 17 or less.

The illumination system may be configured to form a dipole illumination mode

The optical system may comprise a lithographic apparatus.

The patterning device may be an attenuating phase shift mask

According to a second aspect of the invention there is provided a method of measuring speckle in an optical system, the optical system comprising an illumination system configured to condition a radiation beam, the method comprising: configuring the illumination system to form a periodic illumination mode, comprising radiation in a pupil plane of the optical system having a spatial intensity profile which is periodic in at least one direction; measuring a dose of radiation which is received in an field plane of the optical system as a function of position in the field plane; selecting one or more spatial frequencies in the field plane at which variation in the received dose of radiation as a function of position is caused by speckle; and determining a measure of the variation of the received dose of radiation as a function of position at the selected one or more spatial frequencies, the measure of the variation in the dimension being indicative of the speckle in the field plane.

According to a third aspect of the invention there is provided a method of measuring speckle in a lithographic apparatus, the method comprising forming a periodic illumination mode of radiation; patterning the radiation using a pattern comprising a grating; projecting the patterned radiation onto a substrate to form an image of the grating;

measuring line width variation of lines of the imaged grating; and performing a two-dimensional correlation of the line widths in which lines are correlated with themselves and are correlated with other lines of the image The method may further comprise determining a ratio of a local maximum to a central maximum for one or more lines which were correlated with other lines of the image, and using that ratio together with a local maximum for lines which were correlated with themselves to determine a central maximum caused by speckle for the lines which were correlated with themselves The method may further comprise using a previously performed calibration to convert the size of the central maximum to a measurement of dose variation caused by speckle.

The method of the third aspect of the invention advantageously doesn't require a simulation of the effect of speckle, or a measurement of the intensity distribution of the illumination mode in a pupil plane.

According to a fourth aspect of the invention there is provided a method of measuring speckle in a lithographic apparatus, the method comprising forming a periodic illumination mode of radiation; patterning the radiation using a pattern comprising a grating; projecting the patterned radiation onto a substrate to form an image of the grating; measuring variation of the positions of lines of the imaged grating; and performing a two-dimensional correlation of the position variation in which lines are correlated with themselves and are correlated with other lines of the image According to a fifth aspect of the invention there is provided a method of measuring speckle in a lithographic apparatus, the method comprising forming a quadrupole illumination mode of radiation; patterning the radiation using a pattern comprising a two-dimensional array of features; projecting the patterned radiation onto a substrate to form an image; performing a two-dimensional correlation of the critical dimension of the imaged pattern features as a function of pattern feature separation; determining a size of the correlation function away from a central maximum of the correlation function, and using this together with a previously obtained ratio to determine the size of a central maximum of the correlation function that is caused by speckle.

The method of the fifth aspect of the invention advantageously doesn't require a simulation of the effect of speckle, or a measurement of the intensity distribution of the illumination mode in a pupil plane.

According to a sixth aspect of the invention there is provided a method of measuring speckle in a lithographic apparatus, the method comprising forming a quadrupole illumination mode of radiation; patterning the radiation using a pattern comprising a two-dimensional array of features; projecting the patterned radiation onto a substrate to form an image; performing a two-dimensional correlation of the positions of the imaged pattern features as a function of pattern feature separation; determining a size of the correlation function away from a central maximum of the correlation function, and using this together with a previously obtained ratio to determine the size of a central maximum of the correlation function that is caused by speckle.

The method of the sixth aspect of the invention advantageously doesn't require a simulation of the effect of, or a measurement of the intensity distribution of the illumination mode in a pupil plane.

The method of the fifth aspect or the sixth aspect may further comprise using a previously performed calibration to convert the size of the central maximum to a measurement of dose variation caused by speckle.

One or more aspects of the invention may include one or more features of any of the other aspects of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
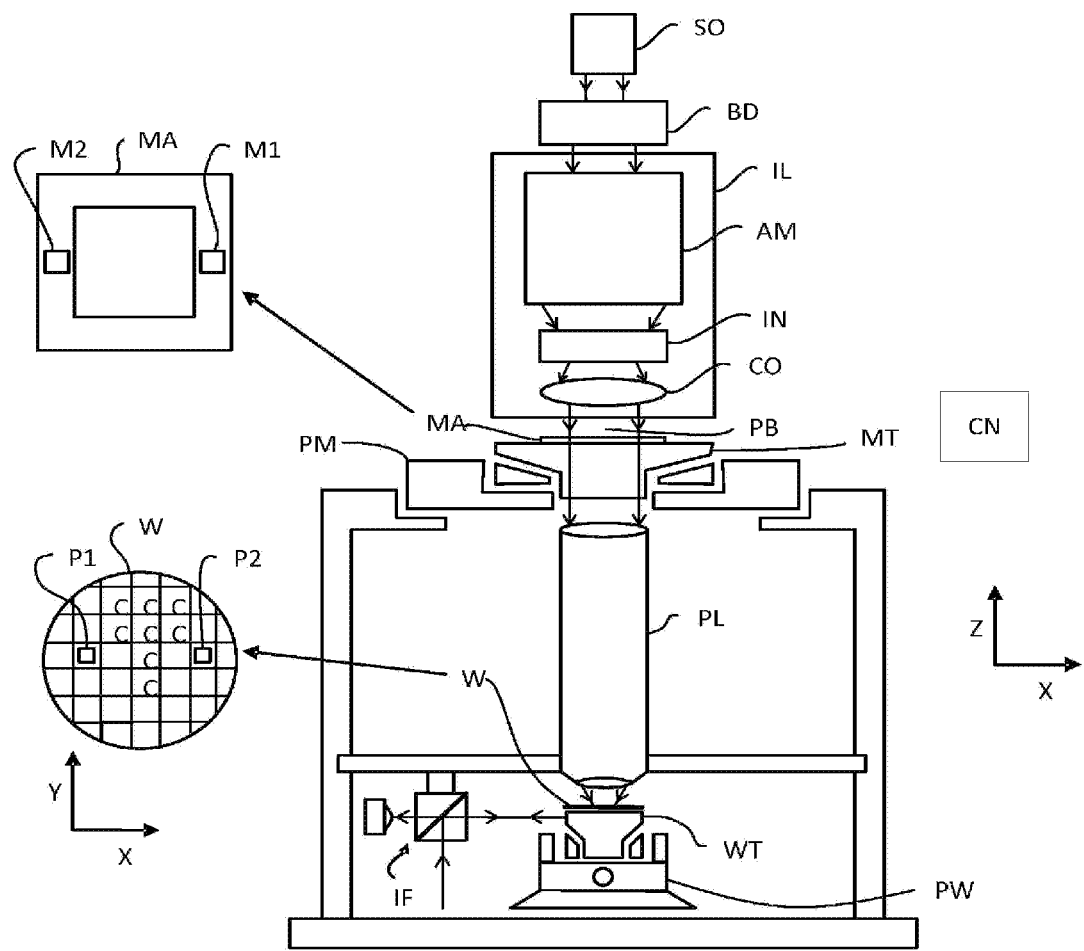
FIG. 1 is a schematic illustration of a lithographic apparatus.

Although specific reference may be made in this text to the use of a lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers. A substrate may be held by a substrate table.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 4-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

A support structure may hold the patterning device. The way in which the support structure holds the patterning device may depend on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The term "illumination system" may also encompass various types of optical components, including refractive, reflective, and catadioptric optical components for directing, shaping, or controlling the beam of radiation, and such components may also be referred to below, collectively or singularly, as a "lens".

A lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

A lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises:

an illumination system (illuminator) IL to condition a beam PB of radiation (e.g. UV radiation or EUV radiation).

a support structure MT to support a patterning device (e.g. a mask) MA and connected to first positioning device PM to accurately position the patterning device with respect to a projection system PL;

a substrate table (e.g. a wafer table) WT for holding a substrate (e.g. a resist coated wafer) W and connected to second positioning device PW for accurately positioning the substrate with respect to the projection system PL;

a projection system (e.g. a refractive projection lens) PL configured to image a pattern imparted to the radiation beam PB by patterning device MA onto a target portion C (e.g. comprising one or more dies) of the substrate W; and a controller CN configured to control one or more components of the lithographic apparatus and/or to compute one or more properties associated with the lithographic apparatus.

As here depicted, the apparatus is of a transmissive type (e.g. employing a transmissive mask). Alternatively, the apparatus may be of a reflective type (e.g. employing a programmable mirror array of a type as referred to above).

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be an integral part of the apparatus. The source SO and the illumination system IL, together with the beam delivery system BD if required, may be referred to as a radiation system.

The illumination system IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illumination system can be adjusted. In addition, the illumination system IL generally comprises various other components, such as an integrator IN and a condenser CO. The illumination system provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:
1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The radiation source SO may emit radiation which exhibits spatial coherence having a coherence length and temporal coherence having a coherence time. For example, in embodiments in which the radiation source SO comprises a laser (e.g. an excimer laser) the emitted laser beam may exhibit spatial and temporal coherence. In the illumination system IL and/or the projection system PS, radiation from different parts of the radiation beam emitted from the radiation source SO may be mixed together. The spatial coherence of the radiation beam may cause different parts of the radiation beam which are mixed together to interfere with each other, thereby forming an interference pattern. In particular an interference effect commonly known as speckle may occur. Speckle is a positional variation in the intensity of a radiation beam which results from mutual interference of a set of wavefronts. For example, radiation in an image plane of a lithographic apparatus may interfere. Consequently an interference pattern is formed in the image plane. The interference pattern may be referred to as a speckle pattern. The substrate W is typically situated substantially in an image plane of the lithographic apparatus LA. A speckle pattern in the image plane will therefore affect the spatial intensity profile of the radiation to which the substrate W is exposed.

During a lithographic process it is desirable to control a dose of radiation which is received at different positions on a substrate W. A received dose of radiation at a given point on a substrate is an integral of the intensity of radiation received at that point over the time for which the point is exposed to radiation.

At a single point in time, different positions on the substrate W may receive different intensities of radiation due to static speckle (the instantaneous speckle pattern). However, the speckle pattern may vary with time. The time scale over which the speckle pattern varies is the coherence time of the radiation beam. If a region of the substrate is exposed to radiation for a period of time (an exposure time) which is much greater than the coherence time, then the speckle pattern will change many times during the exposure time. This may smooth out the effects of the speckle pattern over time and consequently speckle may only cause relatively small variations in the dose of radiation received at different positions across the exposed region of the substrate W.

However, if the exposure time is of the same order of or smaller than the coherence time then the speckle pattern may not change or may only change a few times during the exposure time. Consequently different portions of the exposed region of the substrate W may receive different doses of radiation due to speckle.

In embodiments in which the radiation source SO provides a pulsed radiation beam, the coherence time of the radiation beam may be smaller than the duration of a single pulse of the radiation beam. More than one speckle pattern may therefore occur during a single pulse of the radiation beam. In some embodiments, the exposure period may include multiple pulses of the radiation beam. This may serve to increase the total number of speckle patterns to which a given point on a substrate is exposed thereby temporally averaging out the effect of speckle which is seen over the course of a single exposure period.

In some embodiments, a single pulse of radiation may include many independent speckle patterns. For example, the number of independent speckle patterns in a single pulse of radiation may be greater than 10. In some embodiments the number of independent speckle patterns in a single pulse of radiation may be about 25, about 50 or about 100 or more.

References herein to an "exposure time" are intended to refer to the total amount of time for which a given point on a substrate is exposed to radiation. In embodiments in which a pulsed radiation source is used, the exposure time is equal to an integral over time of all the pulses of radiation to which a given point on a substrate is exposed. The exposure time does not include the time between radiation pulses.

References herein to an "exposure period" are intended to refer to a time period during which radiation (e.g. pulses of radiation) is received by a given point on a substrate. An exposure period may for example, include a number of radiation pulses and includes the time periods between radiation pulses.

A positional variation in radiation dose across a substrate W may affect features which are patterned onto the substrate W. For example the substrate W may be provided with a layer of resist (e.g. using a tool referred to as a track). Regions of the resist are exposed to radiation during a lithographic exposure, thereby causing a state change in exposed regions of the resist. The resist may then be developed by performing an etching process so as to remove either the exposed regions of the resist (which have undergone a state change) or the non-exposed regions of the resist (which have not undergone a state change). Etching of some regions of the resist results in features being patterned into the resist. The patterned features in the resist may form a mask for patterning features into the substrate W, for example, by etching portions of the substrate W from which the resist has been removed.

A dimension of a feature which is patterned into the resist and subsequently into the substrate W, depends on the dose of radiation which is received by the resist (at the substrate W). For example, in some embodiments one or more line features may be patterned into the resist and subsequently onto the substrate W. A width $W_L$ of the line feature depends on the dose of radiation which is received at the substrate W. The width $W_L$ of a lithographic feature may alternatively be referred to as the critical dimension (CD) of the lithographic feature.

In general two different types of resist may be used to form a pattern on a substrate W. The two different types of resist may be referred to as a positive tone resist and a negative tone resist. A negative tone resist is configured to undergo a state change when exposed to radiation, such that exposed portions of the resist are resistant to being etched away during an etching process and thus remain on the substrate W. Portions of the resist which are not exposed to radiation are etched away during an etching process. When using a negative tone resist, an increase in the dose received at the substrate will increase the width $W_L$ of a line feature and a decrease in the received dose will decrease the width $W_L$ of the line feature.

A positive tone resist is configured to undergo a state change when exposed to radiation, such that exposed portions of the resist are etched away during an etching process and are therefore removed from the substrate W. Portions of the resist which are not exposed to radiation are resistant to being etched away and thus remain on the substrate W. During an etching process it is therefore the portions of the resist which are exposed to radiation which are etched away during an etching process. When using a positive tone resist, an increase in the dose received at the substrate W will decrease the line width $W_L$ and a decrease in the received dose will increase the width $W_L$ of the line feature.

Methods which are described herein, seek to determine a dose of radiation which is received at a substrate W as a function of position on the substrate W. This may be achieved through use of either a positive tone resist or a negative tone resist, since when using both forms of resist the line width $W_L$ depends on the dose of radiation which is received. Measurements of the line width $W_L$ of exposed line features as a function of position along the line feature, may therefore be used to determine the dose of radiation which is received at each position along the line feature.

As will be appreciated from the description above, a variation in the dose of radiation which is received at different positions on the substrate W (e.g. caused by speckle) may cause different positions along a line feature to receive different doses of radiation. A variation in the received dose along a line feature may lead to a variation in the width of the line feature at different positions along the line. Variations in the width of a line feature along the length of the line may be referred to as line width roughness. Line width roughness is a common measure used to characterize lithographic features. As was explained above, interference effects, in particular speckle, in a lithographic apparatus LA may affect the line width roughness of lithographic features which are formed by the lithographic apparatus LA.

There is an increasing demand to reduce the size of lithographic features (commonly referred to as a critical dimension). As the critical dimension is decreased the effect of line width roughness becomes an increasingly important factor and there is a desire to understand and quantify the contributions to line width roughness. In general there may be many different effects which contribute to line width roughness and separating these effects is difficult. In particular assessing the contribution of speckle to line width roughness is made difficult by a multitude of stochastic effects which also contribute to line width roughness. Other stochastic effects which contribute to line width roughness may, for example, include effects related to chemical process which occur in a resist used during a lithographic exposure.

For some uses of a lithographic apparatus LA there may be a desire to decrease the bandwidth of the radiation which is provided by the radiation source SO and/or to decrease the number of pulses of radiation which are emitted from the radiation source SO during a single exposure period. Decreasing the bandwidth of radiation generally increases the coherence length and the coherence time associated with the radiation and may therefore increase dose variations which are caused by speckle (the coherence time is equal to the coherence length divided by the speed of light). Decreasing the number of pulses of radiation in an exposure period will decrease the total exposure time for which a given point on the substrate W is exposed to radiation. This will decrease the number of independent speckle patterns which is seen by a given point on the substrate and may therefore increase the influence of speckle on the dose of radiation which is received at the point on the substrate (assuming that the coherence time remains the same). The contribution of speckle to the line width roughness may therefore be particularly important in situations in which reductions in the bandwidth and/or the number of pulses are contemplated.

In general, it is desirable to determine the effects of speckle in a lithographic apparatus. For example, it may be desirable to determine the contribution of speckle to a variation in a lithographic feature which is formed in a substrate W by a lithographic apparatus LA. For example, it may be desirable to determine the contribution of speckle to line width roughness of a line feature formed in a substrate W by a lithographic apparatus LA.

Determining the effects of speckle in a lithographic apparatus LA advantageously allows for a better understanding of the effects of speckle and allows speckle to be properly accounted for when selecting other properties of a lithographic apparatus LA. For example, an understanding of the effects of speckle may advantageously allow the bandwidth and/or the number of pulses (during an exposure period) of radiation emitted from the radiation source SO to be selected whilst accounting for the effects of speckle.

Speckle is often quantified using a speckle contrast C. The speckle contrast C is defined as the standard deviation σ of radiation intensity across an area divided by the mean radiation intensity Ī across the area and may be given by equation (1).

$$C = \frac{\sigma}{\bar{I}} = \frac{1}{\sqrt{N}} \quad (1)$$

Where N is the number of independent speckle patterns to which a given point is exposed during a single exposure period. In embodiments in which the radiation SO comprises a laser which emits a laser beam, the number of independent speckle patterns N is equal to the number of independent laser modes with which the laser operates during a given exposure period. The contribution of speckle to the line width roughness depends on the speckle contrast.

As was mentioned above determining the contribution of speckle to variations in a lithographic feature (e.g. line width roughness) is complicated by other contributions, such as stochastic effects, which also cause variations in the lithographic feature. Embodiments of the invention which are contemplated herein seek to separate the contribution of speckle from other effects by confining the effects of speckle to limited spatial frequencies in an image plane (the plane in which a substrate to be exposed is substantially situated) of the lithographic apparatus LA.

Figure 2:
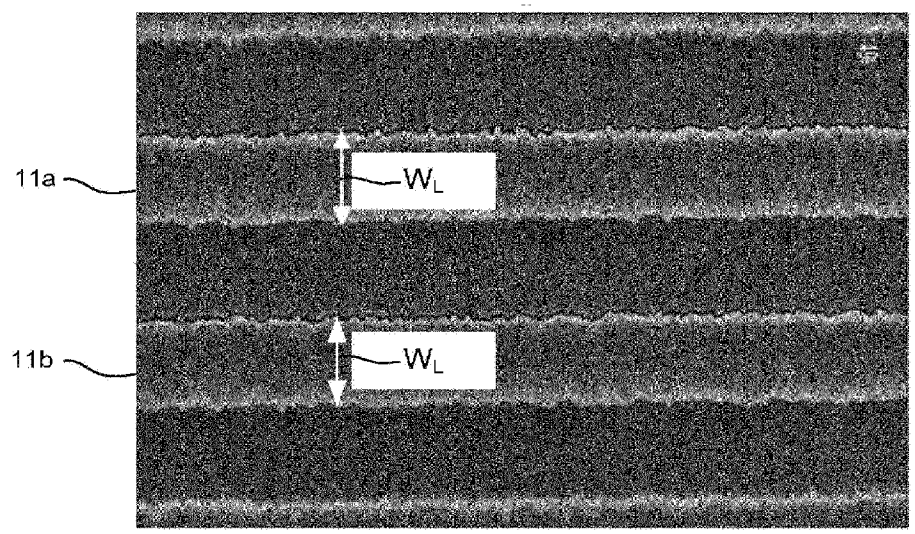
FIG. 2 is a representation of lithographic features which may be formed using the lithographic apparatus of FIG. 1.

Different spatial frequencies in an image plane of a lithographic apparatus may be analysed using signal processing analysis. One or more dimensions of a lithographic feature as a function of position may be treated as a series having different contributions at different spatial frequencies. For example, the line width $W_L$ of a line feature at different positions along the line feature may be treated as a series. FIG. 2 is an image of lithographic line features 11a, 11b which are formed in a substrate W. The image which is shown in FIG. 2 was taken using a scanning electron microscope. The edges of a first lithographic line feature 11a and a second lithographic line feature 11b have been detected and are marked with solid lines in FIG. 2. Edges of lithographic features (such as the lithographic lines 11a, 11b) may be detected using a suitable image processing technique.

Once the edges of the lithographic lines 11a, 11b are detected, the distance between the detected edges may be determined. The distance between the detected edges is the line width and is labelled $W_L$ in FIG. 2. As can be seen in FIG. 2 the line widths $W_L$ of the lithographic line features vary as a function of position along an x-axis. The x-axis runs generally parallel to the direction in which the lithographic lines extend. The line width $W_L$ of each line 11a, 11b at different x positions forms a series having different contributions at different spatial frequencies.

Figure 3:
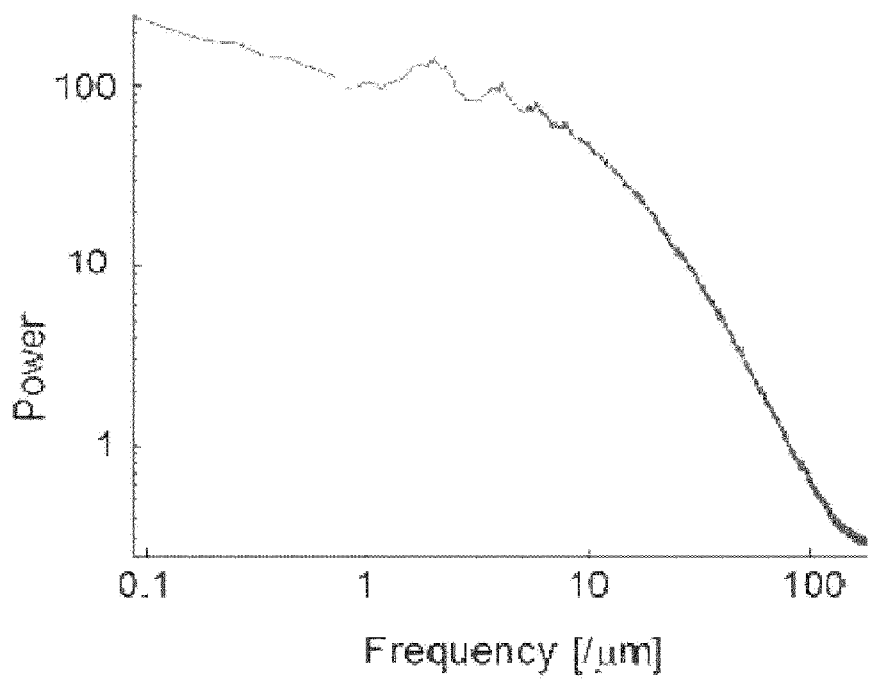
FIG. 3 is a representation of the power spectral density associated with a dimension of the lithographic features shown in FIG. 2.

FIG. 3 is a representation of an average power spectral density of a plurality of line width $W_L$ series as a function of spatial frequency (in microns). The representation which is shown in FIG. 3 represents the contributions at different spatial frequencies to the line width series, which are formed of line widths $W_L$ at different x-positions. The power spectral density of the line width $W_L$ series includes a contribution which is caused by speckle and a contribution which is caused by effects other than speckle. Embodiments of the invention which are contemplated herein seek to separate the contribution which is caused by speckle from the other contribution so as to derive the variation which is caused by speckle.

Figure 4:
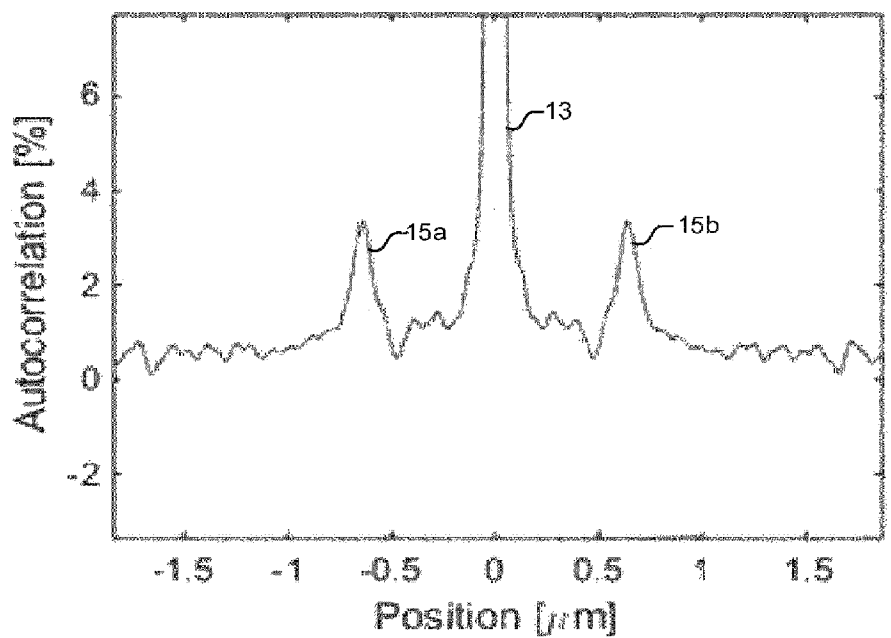
FIG. 4 is a representation of an autocorrelation function associated with a dimension of the lithographic features shown in FIG. 2.

FIG. 4 is a representation of an autocorrelation function (expressed as a percentage) of a line width series as a function of a positional offset (in microns). An autocorrelation function is a measure of the similarity of two series. In the case which is shown in FIG. 4 a first line width series is compared with an identical second series. The first series and the second series are offset from each other by different distances and the autocorrelation between the two series calculated at each offset. FIG. 4 displays the calculated autocorrelation function at different positional offsets between the first and second series.

A large central maximum 13 is seen around an offset of 0 μm in FIG. 4. This central maximum 13 represents a situation in which the first and second series are the same (since there is no offset between them) and the series are therefore highly correlated. The height of the central maximum 13 is equal to the total variance (the standard deviation a squared) of the line width series. At either side of the central maximum 13, a first local maximum 15a and a second local maximum 15b can be seen. The first and second local maxima 15a, 15b represent a positional offset at which there is an increased correlation between the first and second series (when compared to other surrounding offsets).

The power spectral density of a line width series at different frequencies (as shown in FIG. 3) and/or the autocorrelation of a line width series at different offsets (as shown in FIG. 4) may in some embodiments be used to analyse a line width series at one or more spatial frequencies. If the contribution of speckle is confined to limited spatial frequencies then tools such as the power spectral density and/or the autocorrelation function may be used to separate the effects of speckle from other stochastic effects.

There exists a Fourier relationship between the autocorrelation of the speckle contrast in an image plane of an optical system and the intensity profile of radiation in an illumination pupil of the optical system. This Fourier relationship may be used to confine the contribution of speckle in the image plane to limited spatial frequencies. For example, if radiation in the illumination pupil has a periodic intensity profile then this serves to confine the contribution of speckle in the image plane to limited spatial frequencies, which are determined by the period of the intensity profile in the illumination pupil.

Figure 5:
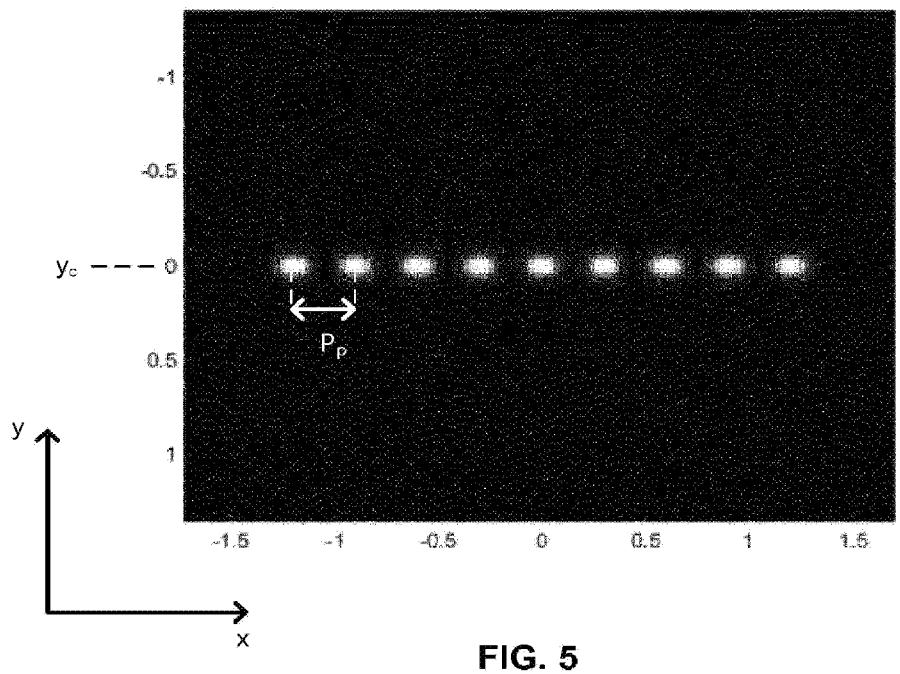
FIG. 5 is a representation of a spatial intensity profile of radiation in a pupil plane of an illumination system which forms part of the lithographic apparatus of FIG. 1.

FIG. 5 is a schematic representation of an intensity profile of radiation in an illumination pupil of a lithographic system. Light shades in FIG. 5 represent high intensity and dark shades represent low intensity. The illumination pupil is a pupil plane which determines the illumination of a patterning device MA which is situated in an object plane. The illumination pupil has a Fourier relationship with the object plane in which a patterning device MA is situated. That is, the spatial intensity profile of radiation in the illumination pupil determines the angular intensity profile of radiation in the object plane.

The illumination system IL is operable to control the spatial intensity profile in the illumination pupil, thereby controlling the angular intensity profile with which a patterning device MA is illuminated. For example, during a typical lithographic exposure, the illumination system IL may be configured to limit the spatial extent of radiation in the illumination pupil to a plurality of pole regions (e.g. a dipole or quadrupole arrangement) so as to form a multi-pole illumination mode. A multi-pole illumination mode causes the patterning device MA to be illuminated from one or more discrete ranges of angles.

The illumination pupil which is shown in FIG. 5 has a periodic intensity profile in an x-direction, which is indicated in FIG. 5. In the embodiment which is shown in FIG. 5, the intensity is a sinusoidal function of position on the x-axis. The sinusoidal function has a period $P_p$. The sinusoidal function may, for example, be a cosine function such that the radiation intensity at a central x-position in the illumination pupil (x=0 in FIG. 5) is substantially a local maximum or a local minimum. It will be appreciated that the intensity of radiation cannot be negative at any position in the illumination pupil. In practice, the radiation intensity as a function of x-position in the illumination pupil may be proportional to 1+cos(x). Such an intensity distribution is considered to be, an example, of a sinusoidal function and an example of a cosine function.

The intensity as a function of position on the y-axis follows a Gaussian distribution centred on a central y position $y_c$ (y=0 in FIG. 5). Using a Gaussian distribution in the y-direction restricts the y-extent of the radiation in the illumination pupil to a central region of the y-domain. The y-direction used herein denotes the scanning direction in which the substrate W and/or the patterning device MA are scanned relative to each other. The x-direction used herein denotes the non-scanning direction which is perpendicular to the scanning direction.

For the purposes of the methods described herein it is desirable for isofocal behaviour to occur at the substrate W. Isofocal behaviour means that no line width $W_L$ variations are introduced due to changes in focus across the image plane. Consequently variations in the line width $W_L$ may be uniquely attributed to variations in dose and are not caused by variations in focus. This allows the line width $W_L$ variation to be measured and used to determine the dose variation.

Isofocal behaviour may be realised by restricting the extent (in the illumination pupil) of radiation in the y-direction and centring the intensity profile of radiation in the y-direction about a central y-position $y_c$. However, if the extent of the radiation in the y-direction is too small then this may cause high values of local radiation intensity in the illumination system IL, which may cause damage to components of the illumination system IL. The extent of the radiation in the y-direction may therefore be about 3% or greater of the y-extent of the illumination pupil.

Whilst the extent of radiation in the y-direction is restricted to a central region of the illumination pupil, as radiation passes through a patterning device MA, one or more diffraction orders may be formed. For example, radiation may pass through a line feature of the patterning device MA and form −1, 0 and +1 diffraction orders (and may form higher order diffraction orders). In a pupil plane of the projection system PL the diffraction orders may be distributed in the y-direction such that the extent of the radiation in the y-direction is no longer restricted to a central y-region but also includes +1 and −1 diffraction orders positioned either side of the central y-region. In order to maintain isofocal behaviour, it may be desirable to restrict the diffraction orders which pass through the projection system PL to +1, 0 and −1 diffraction orders. This may be achieved, for example, by selecting the pitch of features on the patterning device MA relative to the numerical aperture NA of the projection system PL. The pitch of the features on the patterning device MA may, for example, be greater than λ/NA and may be less than 2λ/NA, where λ is the wavelength of the radiation. It may be further desirable to select the duty cycle of features on the patterning device MA such that isofocal behaviour is maintained at low exposure doses.

The patterning device MA may, for example, include features which have a pitch of approximately 160 nm. The wavelength A of radiation may be approximately 193 nm and the numerical aperture NA of the projection system may be approximately 1.35. In such an embodiment a pitch of approximately 160 nm is greater than λ/NA and less than 2λ/NA. In an embodiment each pitch may, for example, include a transmissive region having a width of approximately 120 nm and an attenuating region having a width of approximately 40 nm. This may provide a duty cycle which maintains isofocal behaviour at low exposure doses.

In an alternative embodiment, the patterning device MA may, for example, comprise an alternating phase shift mask which is configured to provide higher contrast than the above described patterning device. In an embodiment, the alternating phase shift mask may comprise a grating with a pitch of approximately 160 nm. The wavelength A of radiation may be approximately 193 nm and the numerical aperture NA of the projection system may be approximately 1.35. One period of the alternating phase shift mask may comprise a first attenuating portion with a width of 40 nm, a first transparent portion with a width of 40 nm, a second attenuating portion with a width of 40 nm and a second transparent portion with a width of 40 nm. The second transparent portion may be configured to apply a phase shift of 180° to incident radiation, and the first transparent portion may be configured to apply no phase shift. This alternating phase shift configuration acts to attenuate radiation in the zero diffraction order, and this in turn increases the contrast of the image formed on the substrate W (radiation in the first diffraction order is not attenuated). Attenuation of the zero diffraction order may substantially eliminate the zero diffraction order because the average E-field of the radiation in that order is zero. In addition to increasing the contrast of the image which is formed at the substrate, eliminating the zero diffraction order also advantageously halves the pitch of the grating image formed at the substrate.

In a further alternative embodiment, the patterning device (NA) may, for example comprise a grating formed as an alternating phase shift mask which does not include attenuating portions (i.e. the mask features comprise entirely of regions which apply relative phase shifts).

The intensity profile of the illumination pupil which is shown in FIG. 5 is periodic in the x-direction and is used to expose line features which extend in the x-direction. In alternative embodiments line features which extend in the y-direction may be exposed. In such embodiments, the illumination pupil may be periodic in the y-direction, as opposed to the x-direction (as shown in FIG. 5). The intensity in the x-direction may follow a Gaussian distribution centred on a central x-position.

The intensity profile in the illumination pupil may be established by controlling the illumination system IL. The illumination system IL may, for example, comprise an array of mirrors whose orientation may be adjusted. Each of the mirrors of the array of mirrors may receive a portion of the radiation beam provided from the radiation source SO and may direct the received portion of the radiation beam according to the orientation of the mirror. The orientation of mirrors may be configured so as to form a desired spatial intensity profile in the illumination pupil. For example, the orientation of the mirrors may be configured so as to form the spatial intensity profile which is shown in FIG. 5.

In the embodiment which is shown in FIG. 5 the illumination pupil includes 9 periods $P_p$ in the x-direction. In other embodiments the illumination pupil may include more than or fewer than 9 periods $P_p$ in the x-direction. It may be desirable for the illumination pupil to include an integer number of periods $P_p$ in the x-direction. In some embodiments, the illumination system IL may be restricted to forming symmetric spatial intensity profiles in the illumination pupil. For example, the illumination system IL may form spatial intensity profiles which exhibit reflection symmetry about a central x-position and/or reflection symmetry about a central y-position. The symmetry of the illumination pupil may restrict the possible number of periods $P_p$ in the x-direction to odd numbers of periods.

In general the spatial intensity distribution in the illumination pupil may include a total of K periods. In some embodiments K is an integer. In some embodiments K is an odd number. The number K of periods in the illumination pupil may be greater than 2. In some embodiments the number K of periods in the illumination pupil may be 5 or more. In some embodiments the number K of periods in the illumination pupil may 17 or less.

As was described above, providing a periodic spatial intensity profile in the illumination pupil (as shown in FIG. 5) serves to confine the effects of speckle to limited spatial frequencies in the image plane in which the substrate W is situated. The spatial frequency at which speckle effects are visible in the image plane (in which the substrate W is situated) has a period $P_s$. The period $P_s$ at which speckle effects are visible is related to the periodicity of the spatial intensity profile in the illumination pupil according to equation (2).

$$P_S = \frac{\lambda K}{2NA} \quad (2)$$

Where $\lambda$ is the wavelength of the radiation beam provided by the radiation source SO, NA is the numerical aperture of the projection system PL and K is the number of periods $P_p$ in the illumination pupil (as was described above).

Figure 6:
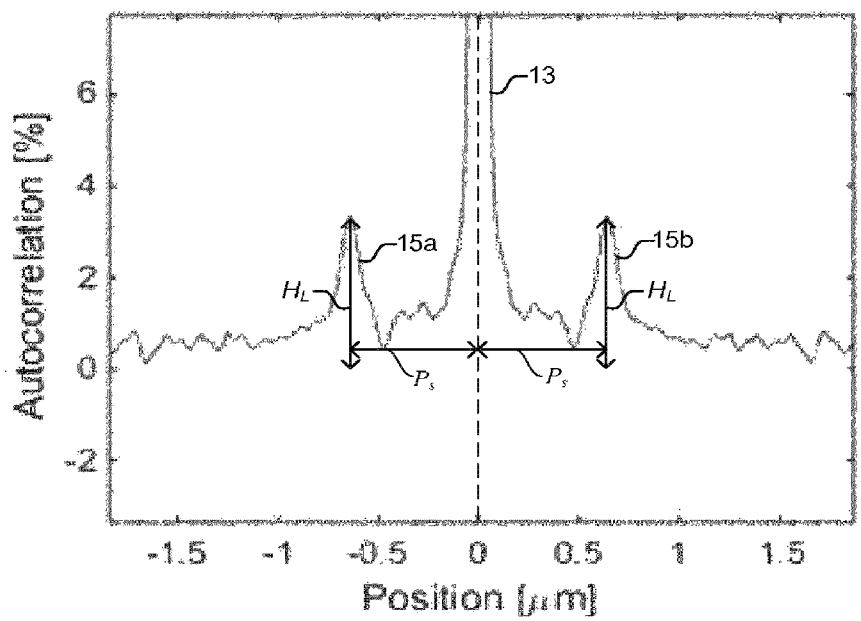
FIG. 6 is a representation of an autocorrelation function associated with a dimension of a lithographic feature.

FIG. 6 is a schematic representation of an autocorrelation function associated with a line width series, which results from the exposure of a lithographic line feature using a periodic illumination pupil (e.g. the illumination pupil shown in FIG. 5). As was explained above with reference to FIG. 4, the autocorrelation function includes a large central maximum 13 centred at a positional displacement of 0, due to a high correlation between identical series (with no displacement between them). Either side of the central maximum 13 is situated a first local maximum 15a and a second local maximum 15b. The first and second local maxima 15a, 15b are situated at a distance $P_s$ either side of 0 (at which the central maximum 13 is centred) and represent an increased correlation when the line width series is offset from itself by a distance $P_s$. The increased correlation displayed at the first and second local maxima 15a, 15b is caused by the effects of speckle which has been confined to limited spatial frequencies centred at a frequency of $1/P_s$ by a periodic illumination pupil containing K periods. The first and second local maxima 15a, 15b may therefore provide a measure of speckle at the substrate W. For example the height $H_L$ of first and second local maxima 15a, 15b may be indicative of the contribution of speckle to the line width roughness.

The contribution of speckle at a spatial frequency of $1/P_s$ will also be visible in a representation of the power spectral density of a line width series as a function of frequency (not shown). The effects of speckle will result in a local maximum of the power spectral density at spatial frequencies of $l/P_s$, where l is a positive integer and $l \leq K$.

Figure 7:
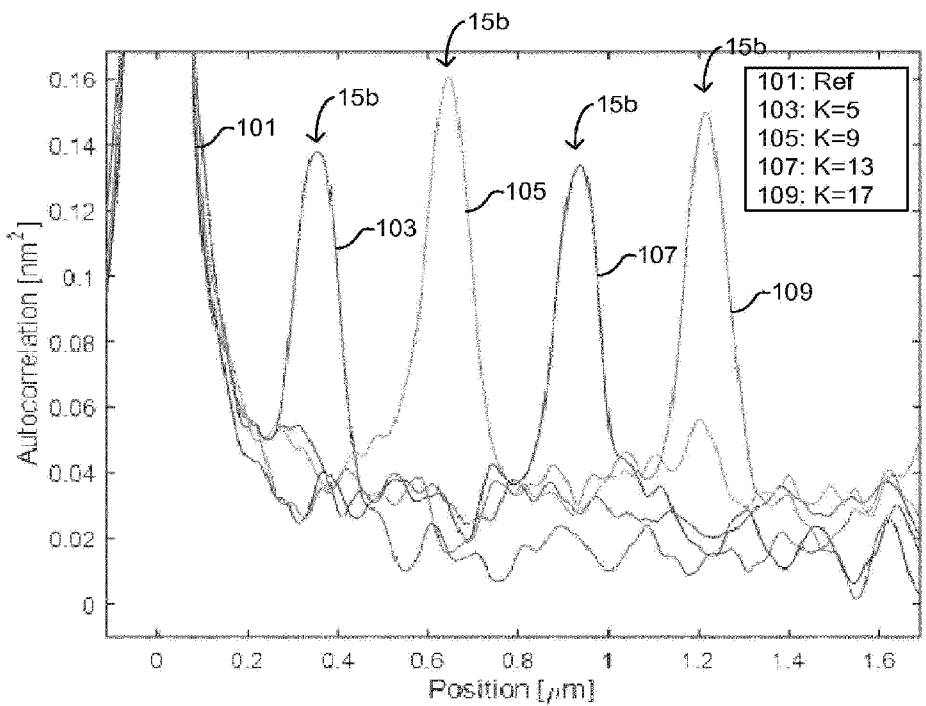
FIG. 7 is a representation of autocorrelation functions associated with dimensions of lithographic features formed using different illumination modes.

FIG. 7 is a representation of autocorrelation functions associated with a number of different line width series. The different line width series which are shown in FIG. 7 represent the line widths which result from exposure of line features using different illumination pupils. A first curve 101 which is shown in FIG. 7 represents a reference exposure in which an illumination pupil which is not periodic is used. A second curve 103 represents an exposure performed with 5 periods in the illumination pupil (K=5). A third curve 105 represents an exposure performed with 9 periods in the illumination pupil (K=9). A fourth curve 107 represents an exposure performed with 13 periods in the illumination pupil (K=13). A fifth curve 109 represents an exposure performed with 17 periods in the illumination pupil (K=17).

Each of the autocorrelation functions shown in FIG. 7 exhibit a second local maximum 15b. The autocorrelation functions also exhibit first local maxima, however these are not shown in FIG. 7. As can be seen in FIG. 7, the position and height of the local maxima 15b is different for different illumination pupils. As was explained above, the position of a local maximum is the period $P_s$ at which speckle effects are visible. The period $P_s$ is given by equation (2) above and depends on the number K of periods in the illumination pupil. The position of the local maxima 15b is therefore different for different numbers of periods K in the illumination pupil as can be seen in FIG. 7.

Figure 8:
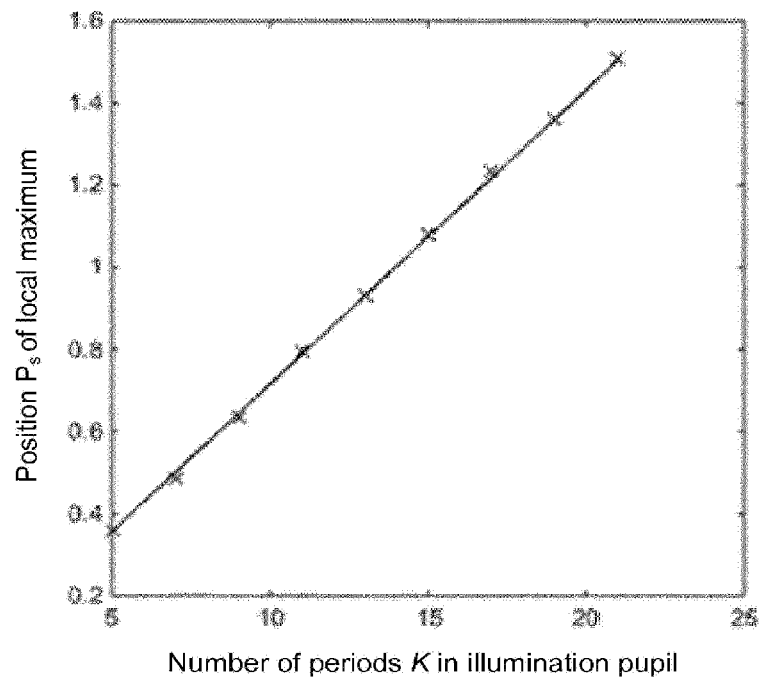
FIG. 8 is a representation of the position of local maxima in the autocorrelation functions of FIG. 7.

FIG. 8 is a representation of the position of different local maxima 15b which are observed when using different numbers K of periods in the illumination pupil. The position of the local maxima 15b is equivalent to the period $P_s$ at which speckle effects are visible. The data shown in FIG. 8 was obtained by exposing a number of different line features using different numbers K of periods in the illumination pupil. The line features in the substrate W were observed using a scanning electron microscope to produce images of the line features. The images were analysed to detect the edges of the line features so as determine the line widths $W_L$ at different positions along the lines. Line widths $W_L$ at different positions along the lines were used to construct line width series.

For each illumination mode having a given number K of periods in the illumination pupil, a plurality of different line features may be exposed and a line width $W_L$ series may be derived from each exposed line feature. For example, in some embodiments more than about 100 line features may be exposed thereby providing more than about 100 line width series for a given illumination mode. In some embodiments more than about 1000 line features may be exposed in order to provide more than about 1000 line width series for a given illumination mode. A plurality of line width series for a given illumination mode may be used to calculate an average power spectral density for the given illumination mode.

The average power spectral density for each illumination mode having a number K of periods is used to calculate an autocorrelation function for each number K of periods. The autocorrelation functions are calculated at different positional offsets and the positions of the local maximum determined, thereby providing the data which is shown in FIG. 8. As can be seen in FIG. 8, the positions of the local maxima increases proportionally with the number of periods K as predicted by equation (2).

Figure 9:
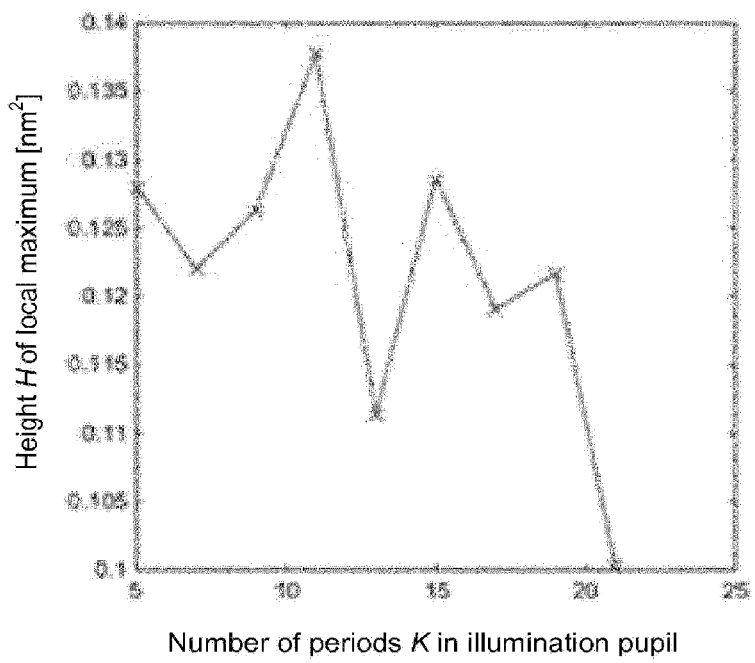
FIG. 9 is a representation of the height of local maxima in the autocorrelation functions of FIG. 7.

FIG. 9 is a representation of the height of the local maxima 15b for different values of K. As can be seen from FIG. 9, the height of the local maxima 15b is different for different values of K. This variation in the height of the local maxima 15b is largely due to differences in the illumination modes at different values of K. Some variation in the height of the local maxima 15b shown in FIG. 9 may also be due to small differences in experimental conditions when carrying out the exposures.

The autocorrelation function contains a contribution from speckle and contributions from other stochastic effects (e.g. the result of chemical processes which occur in a resist used during the exposure process). As was described above, by using a periodic illumination mode, the effects of speckle are advantageously confined to a limited number of spatial frequencies. Consequently the height of a local maximum 15b in an autocorrelation function is mostly due to the contributions of speckle. The height of a local maximum 15b thus depends at least in part on the speckle contribution and may be used to determine the contribution of speckle to line width roughness. However, the height of a local maximum 15b also includes some contribution from other stochastic effects. It is desirable to separate the contribution of speckle from other contributions.

The contribution of speckle may be separated from other contributions by deriving a reference autocorrelation function which represents a situation in which an illumination mode which is not periodic is used (e.g. the first curve 101 which is shown in FIG. 7). For example, an illumination mode comprising an intensity profile in a pupil plane which is not periodic may be used to expose one or more line features. An autocorrelation function corresponding to the exposed line features may be computed and this autocorrelation function may serve as a reference autocorrelation function. The reference autocorrelation function will include contributions from speckle but these contributions are spread across all spatial frequencies (since a non-periodic illumination mode is used). The height of the reference autocorrelation function at each positional offset will therefore mostly be due to contributions other than speckle and which do not depend on the illumination mode which is used. The reference autocorrelation function may be subtracted from an autocorrelation function which is derived using a periodic illumination mode in order to separate the effects of speckle from other contributions. For example, the difference between the height of a local maximum 15b in an autocorrelation function derived using a periodic illumination mode and the height of the reference autocorrelation function at the same positional offset may be determined. The resulting difference is a measure of the contribution of speckle to the line width roughness (with other contributions subtracted) using a particular illumination mode.

A determined height of a local maximum 15b in an autocorrelation function may be denoted $H_L$. The height of a reference autocorrelation function at a positional offset corresponding to a local maximum 15b in an autocorrelation function derived using a periodic illumination mode may be referred to as a reference local maximum height and may be denoted $H_{LR}$. The difference between the determined height $H_L$ and the reference height $H_{LR}$ may be referred to as the speckle local maximum height and may be denoted $H_{LS}$ where $H_{LS}=H_L-H_{LR}$.

In some embodiments a reference autocorrelation function (including the reference local maximum height $H_{LR}$) may be derived by means other than performing an exposure using a non-periodic illumination mode. For example, in some embodiments a reference autocorrelation function may be estimated from an autocorrelation function which is determined using a periodic illumination mode, by considering the autocorrelation function at positional offsets either side of a local maximum 15b. That is, the height of an autocorrelation function either side of a local maximum 15b may be used to estimate the height of the autocorrelation function $H_{LR}$ (at positional offsets corresponding to the local maximum) which would occur if the local maximum was not present (corresponding to a case where a non-periodic illumination mode is used).

Methods have been described above for deriving the contribution of speckle when using a specific illumination mode. For example, the speckle local maximum height His provides a measure of the contribution of speckle. However, this measure is dependent on the illumination mode which is used to form the autocorrelation function and may be different for different illumination modes.

It may be desirable to provide a measure of the contribution of speckle which is independent of the illumination mode which is used during a measurement process. This measure may then be used to estimate the contribution of speckle when exposures are performed using illumination modes which are different to the illumination mode used during the measurement process. For example, during a typical lithographic exposure process it may be desirable to use a multipole illumination mode (e.g. a dipole illumination mode). A multipole illumination mode is different to a periodic illumination mode which may be used to measure the contribution of speckle. It is therefore desirable to provide a measure of the contribution of speckle which is relevant to all illumination modes.

A measure of the contribution of speckle which is independent of the illumination mode which is used may, for example, comprise a variance (or equivalently a standard deviation σ) of line width $W_L$ which is caused by speckle. In some embodiments a measure of the contribution of speckle which is independent of the illumination mode which is used may comprise a variance (or equivalently a standard deviation σ) of a dose of radiation which is caused by speckle. In some embodiment a measure of the contribution of speckle which is independent of the illumination mode which is used may, for example, comprise the speckle contrast C. Equivalently a measure of the contribution of speckle which is independent of the illumination mode which is used may comprise the number N of independent speckle patterns to which a given point on a substrate is exposed during a single exposure period. As was explained above, in embodiments in which the radiation source SO comprises a laser (e.g. an excimer laser) the number N of independent speckle patterns is equal to the number of active independent laser modes which are excited in the laser during an exposure period.

As was mentioned above the height of the central maximum 13 of an autocorrelation function is equal to the total variance (standard deviation σ squared) of a line width series. It may be desirable to determine the variance (or equivalently the standard deviation σ) of a line width series which is due to speckle. That is, it may be desirable to determine the height of the central maximum (i.e. the total variance) which would result if the only contributor to the variance was speckle. Using the measurement process described above the height of a resulting central maximum 13 (i.e. the total variance) will include other contributions as well as the contributions from speckle. A determination of the height of the resulting central maximum 13 using the above described measurement process does not therefore directly lead to the contribution of speckle to the variance.

In some embodiments the height of a local maximum 15b may be used to estimate the height of a central maximum 13 in an autocorrelation function corresponding to variation which is only caused by speckle. That is, the height of a local maximum 15b may be used to estimate the total variance due to speckle. An autocorrelation function corresponding to variation only caused by speckle may be referred to as the speckle autocorrelation function. As was explained above, after subtraction of a reference autocorrelation function, the height of a local maximum 15b in an autocorrelation function (referred to as the speckle local maximum height $H_{LS}$) may be considered to be only due to the effects of speckle and not due to any other contributions. The speckle local maximum height His may therefore be considered to be a point on a speckle autocorrelation function. If the general shape of the speckle autocorrelation function is known then the determination of a point on the speckle autocorrelation function may be used to determine other points on the speckle autocorrelation function. In particular if the ratio between a local maximum 15b and a central maximum 13 in a speckle autocorrelation function is known then the determination of the of speckle local maximum height His may be used to determine the height of a central maximum in the speckle autocorrelation function.

The height of the central maximum 13 in a speckle autocorrelation function may be referred to as the speckle central maximum height and may be denoted $H_{CS}$. As was explained above it may be desirable to determine the ratio $R_S$ between the speckle central maximum height $H_{CS}$ and the speckle local maximum height $H_{LS}$ as given by equation (3).

$$R_S = \frac{H_{LS}}{H_{CS}} \quad (3)$$

The ratio $R_S$ may be used to determine the speckle central maximum height $H_{CS}$ from an experimentally determined value of the speckle local maximum height $H_{LS}$. The ratio $R_S$ may depend on the illumination mode which is used. It may therefore be desirable to determine the ratio $R_S$ for the same illumination mode for which the determination of the speckle local maximum height $H_{LS}$ is performed.

In some embodiments, the ratio $R_S$ may be determined through measurement of the intensity profile of the illumination pupil. The intensity profile of the illumination pupil may, for example, be determined by measuring the angular intensity profile of radiation which is received at an image plane of the projection system PL. For example, a patterning device MA comprising a small pin-hole aperture may be positioned in an object plane such that radiation only passes through a small extent of the object plane. The aperture in the patterning device MA receives radiation having an angular distribution which depends on the illumination pupil being used. Radiation propagates through the aperture and through the projection system PL and is imaged onto an image plane (a plane in which a substrate W is located during a lithographic exposure). The angular intensity profile of radiation in the image plane may be measured using one or more image sensors. For example a wavefront sensor may be used to derive the angular intensity profile of radiation in the image plane. A wavefront sensor which may be used to derive the angular intensity profile of radiation in the image plane may already be present in a lithographic apparatus and may be operable to measure wavefront aberrations caused by the projection system PL.

The angular intensity profile in the image plane is equivalent to the spatial intensity profile in the illumination pupil. A Fourier transform of the spatial intensity profile in the illumination pupil (or equivalently the angular intensity distribution in the image plane) may be determined. The Fourier transform, of the spatial intensity profile of the illumination pupil is equivalent to the autocorrelation function of the intensity profile in a field or image plane (e.g. the image plane in which a substrate W is situated). The Fourier transform of the spatial intensity profile of the illumination pupil may therefore be referred to as the autocorrelation function of the illumination pupil.

Figure 10:
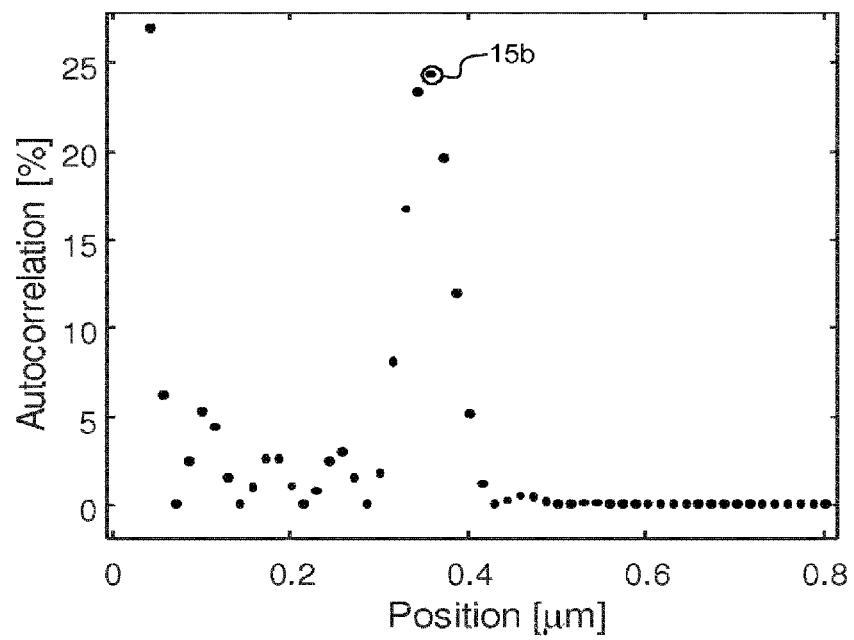
FIG. 10 is a representation of an autocorrelation function associated with a spatial intensity profile of radiation in a pupil plane of an illumination system.

FIG. 10 is a representation of the autocorrelation function of a measured intensity in an illumination pupil at different positional offsets. The autocorrelation function which is shown in FIG. 10 is calculated by measuring the intensity in the illumination pupil at different positions. At each x-position the radiation intensity over all y-positions may be summed to provide a sum of the radiation intensity at a given x-position. Summations over y of the radiation intensity at different x-positions provides a series of intensity measurements at different x-positions. A Fourier transform of this series may be performed in order to determine the autocorrelation function which is shown in FIG. 10. The autocorrelation function which is shown in FIG. 10 is shown as a percentage of the height of a central maximum (not shown in FIG. 10) in the autocorrelation function.

As can be seen in FIG. 10 a local maximum 15b occurs in the autocorrelation function. The local maximum 15b lies at a position which is equivalent to the period $P_p$ of the periodic intensity profile in the illumination pupil and has a height which is approximately 25% of the height of a central maximum in the autocorrelation function.

The ratio between the central maximum height and the local maximum height may be approximately the same for the autocorrelation function of the intensity profile of the illumination pupil as it is for the speckle autocorrelation function. The ratio between the central maximum height and the local maximum height may therefore be determined from the autocorrelation function of the intensity profile of the illumination pupil and may be used as an estimate of the ratio $R_S$ which is given by equation (3). The estimated ratio $R_S$ may be used to determine the speckle central maximum height $H_{CS}$ from the speckle local maximum height $H_{LS}$ by rearranging equation (3).

Figure 11:
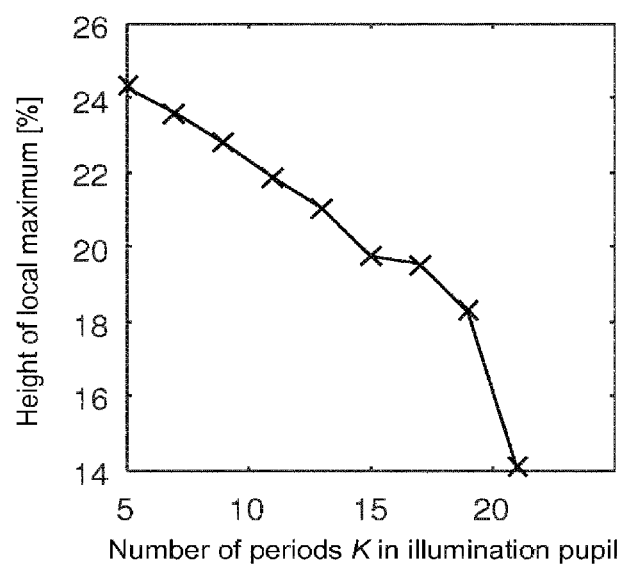
FIG. 11 is a representation of the height of local maxima in autocorrelation functions associated with different spatial intensity profiles of radiation in a pupil plane of an illumination system.

FIG. 11 is a representation of the height of the local maximum 15b in the autocorrelation function of the of the illumination pupil (as a percentage of the height of the central maximum in the autocorrelation function) for different illumination modes having different values of the number of periods K in the illumination pupil. The heights of the local maxima as shown in FIG. 11 and as expressed as a percentage may provide an estimate of the ratio $R_S$ (as expressed by equation (3)) for a number of different numbers of periods K in the illumination pupil Using the above described process it is possible to deduce the contribution of speckle to the variance of line width roughness. For example, in a particular experiment an illumination mode having 17 periods in the illumination pupil (i.e. K=17) was used to expose a number of line features. Measurements of the resulting line width at different positions along the exposed line features were used to determine an autocorrelation function similar to the autocorrelation function which is shown in FIG. 6. It was deduced that the height of a central maximum 13 in the autocorrelation function associated with a measured line width series was approximately 3.68 nm$^2$. As was described above, the height of the central maximum 13 in the autocorrelation function is equal to the total variance (including contributions from speckle and other effects) in the line width. The corresponding standard deviation σ (the square root of the variance) is approximately 1.92 nm.

As can be seen from FIG. 7 the height of the local maximum in the autocorrelation function associated with a value of K=17 was found to be approximately equal to 0.12 nm$^2$. FIG. 11 shows that at a value of K=17, the height of a local maximum of the autocorrelation function associated with the illumination pupil is approximately 20%. The ratio $R_S$ between the speckle central maximum height $H_{CS}$ and the speckle local maximum height $H_{LS}$ for a value of K=17 is therefore approximately 0.2. By rearranging equation (3) the speckle central maximum height $H_{CS}$ is given by $H_{LS}/R_S$=0.12/0.2=0.6 nm$^2$. As was explained above, the speckle local maximum height $H_{LS}$ is the variance in the line width which is caused by speckle. The variance which is caused by speckle is therefore estimated to be 0.6 nm$^2$. The corresponding standard deviation σ of the line width which is caused by speckle is given by $\sqrt{0.6}$=0.77 nm.

The variation in the line width which is caused by speckle may be used to determine the variation in dose which is caused by speckle. As was explained above the line width of a feature depends on the dose of radiation which is received. The variation in line width of a feature therefore depends on the variation in the dose of radiation which is received. The relationship between the dose of radiation and the line width is dependent on the illumination pupil which is used and may be determined by separate experimentation. For example, experiments may be performed in which a number of different line features are exposed using a given illumination mode. The dose of radiation to which the substrate is exposed may be varied and the resulting variation in the line width may be measured. These measurements may be used to derive the sensitivity of the line width to variations in the dose for a particular illumination mode. The same process may be performed using a number of different illumination modes in order to derive the sensitivity of the line width to variations in the dose for each illumination mode.

The sensitivity of the line width to variations in the dose for a given illumination mode may be used to convert a line width variation into a dose variation. For example, a lookup table of sensitivities of the line width to variations in dose for different illumination modes may be stored. The lookup table may be referred to and may be used to convert a measured line width variation into a dose variation. The linewidth variation which is caused by speckle may depend on the illumination mode which is used. However, the dose variation which is caused by speckle may be independent of the illumination mode which is used. The dose variation which is caused by speckle may therefore be a useful measure of speckle which provides information about the contribution of speckle using any illumination mode.

Using the method described above, in a particular experiment it was determined that a standard deviation σ of 0.77 nm in the line width which is caused by speckle corresponds to a dose variation along a line feature of approximately 0.64% due to speckle. As was explained above this dose variation is independent of the illumination mode.

A method has been described above in which the ratio $R_S$ between the speckle central maximum height $H_{CS}$ and the speckle local maximum height $H_{LS}$ is estimated from a measurement of the spatial intensity profile of the illumination pupil. In other embodiments the ratio $R_S$ may be estimated using other means. For example, in some embodiments a simulation may be used to estimate the ratio $R_S$. For example, a simulation of radiation propagating through the projection system PL may be performed in order to derive a simulated speckle pattern. An autocorrelation function may be derived from the simulated speckle pattern. The height of the central maximum and the height of a local maximum in the simulated autocorrelation function may be used to determine the ratio $R_S$ of the height of the local maximum to the height of the central maximum. The ratio $R_S$ which is derived through simulation may be used to determine a speckle central maximum height $H_{CS}$ from a speckle local maximum height $H_{LS}$ which is determined through experimentation.

One example of a simulation which may be used to determine a simulated speckle pattern may be a Monte Carlo simulation. For example, a coherent Monte Carlo simulation may be used to simulate the propagation of radiation through a lithographic apparatus. The input to the simulation may comprise a plurality of radiation sources situation in a plane. Each radiation source may have the same intensity and the relative phase of each source may be simulated as being random. The effect of the illumination system IL, the patterning device MA and projection system PL may be simulated by amplitude filters. At each position in an image plane of the projection system the intensity from each radiation source may be summed to define an intensity at that position. The output of the simulation may therefore be an intensity distribution of radiation in the image plane. The output intensity distribution may be used to derive an autocorrelation function from which the ratio $R_S$ may be derived.

In some embodiments a classical simulation of partially coherent radiation sources may be performed. The simulation may be used to output an optical transfer function of the lithographic apparatus. The optical transfer function is equivalent to the power spectral density from which an autocorrelation function may be derived. The autocorrelation function may be used to determine the ratio $R_S$.

A simulation of partially coherent radiation sources may comprise, modelling the intensity distribution in the illumination pupil as a series of incoherent point radiation sources. Simulated point sources may, for example, be arranged so as to emulate a periodic illumination mode as was described above (for example, the periodic illumination mode depicted in FIG. 5). The envelope of the distribution of point sources in the illumination pupil matches the illumination pupil filling. The propagation of radiation from each point source through the patterning device MA and the projection system is simulated so as to provide a simulation of radiation incident in an image plane of the projection system at which a substrate W is situated. The patterning device MA may be simulated as a periodic series of transmissive lines (e.g. lines extending in a non-scanning direction). For example, the patterning device MA may be simulated as a periodic line pattern having a period of approximately 160 nm.

At the patterning device MA, radiation from each point source in the illumination pupil translates into a plane wave propagating in a given direction. The patterning device MA serves to diffract the simulated plane wave into multiple beams. In the projection system PL, the diffraction pattern may be truncated by the limited numerical aperture NA of the projection system PL. In an image plane of the projection system the intensity profile which results from each point source in the illumination pupil is determined. A summation of the intensity profiles in the image plane resulting from each point source is then performed so as to derive the total intensity profile in the image plane. The summation of the contributions from each point source is performed as an incoherent sum. The simulation of the propagation of radiation through the lithographic apparatus is performed as a coherent sum (i.e. a summation of amplitudes).

In some embodiments, other factors may be taken into account in a simulation. For example, the propagation of radiation into a resist situated in the image plane and/or subsequent development of the resist may be simulated. In some embodiments, the effects of polarization of the radiation may be accounted for in the simulation. For example, polarization effects in the illumination pupil, at the patterning device MA, and in the image plane may be accounted for in the simulation. In some embodiments, a simulation may additionally account for three-dimensional imaging effects, for example, at the patterning device MA and at the substrate W.

Examples of simulations of partially coherent radiation sources which may be used in embodiments of the invention may, for example, include Hyperlith, Prolith and/or Solid-C simulations.

In some embodiments, simulations may be performed using different configurations of the simulated patterning device MA. For example, one or more properties of a simulated patterning device MA may be modulated and a resulting modulation in an output of the simulation (e.g. a simulated radiation intensity profile in an image plane) may be detected. The amplitude of a detected modulation in an output of the simulation may allow a transfer function of the modulation to be determined. A modulation transfer function may be derived as a function of frequency. As was explained above, an optical transfer function of an optical system (e.g. a modulation transfer function) is equivalent to a power spectral density from which an autocorrelation function may be derived. The autocorrelation function may be used to determine the ratio $R_S$.

In some embodiments one or more properties of a simulated patterning device MA may be modulated with a modulation amplitude of approximately 5% or less of a mean value of the property. In some embodiments, a width of a simulated patterning device MA may be modulated as described above.

In some embodiments the ratio $R_S$ may be determined experimentally. For example, a plurality of exposures may be performed using different numbers of pulses of the radiation source SO in a single exposure period. As was explained above, the number of pulses to which a point on a substrate is exposed affects the number N of independent speckle patterns to which the point is exposed during a given exposure period (assuming that the duration of the pulse remains the same). For example increasing the number of pulses during an exposure period will increase the number N of speckle patterns to which a point on the substrate is exposed.

Figure 12:
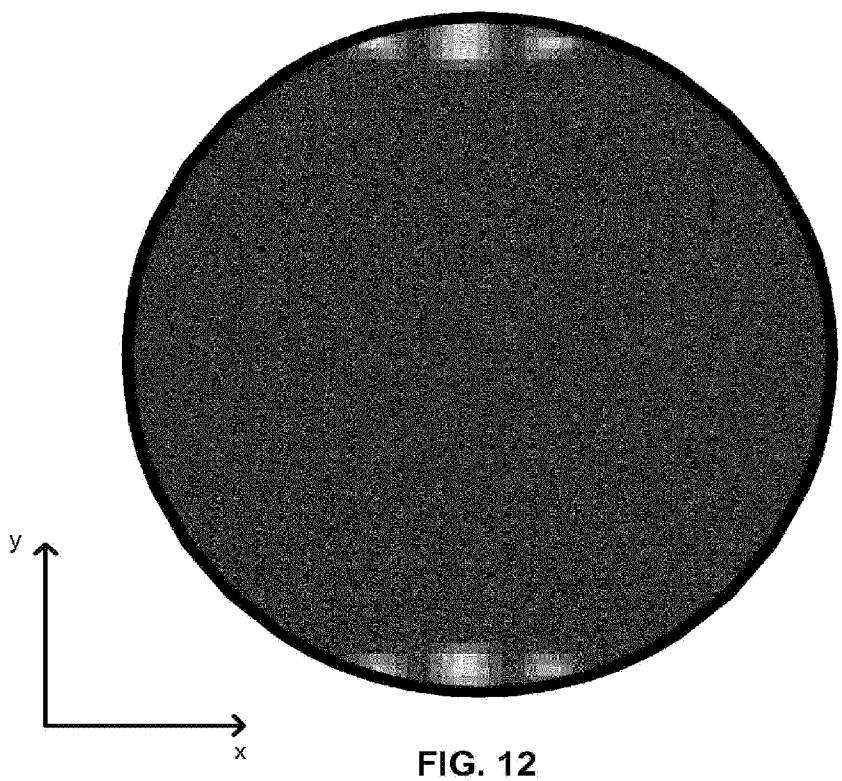
FIG. 12 is an illumination mode used by an embodiment of the invention.

FIG. 12 is a schematic representation of an intensity profile of radiation in an illumination pupil of a lithographic system according to an alternative embodiment of the invention. Lighter areas in FIG. 12 represent higher intensity of radiation and darker areas represent lower intensity of radiation. The radiation is in a dipole mode, i.e. with no radiation in the centre of the illumination pupil in the y-direction but with radiation poles separated in the y-direction (at y-direction edges of the illumination pupil). The illumination pupil schematically depicted in FIG. 12 has a periodic intensity profile in the x-direction. The intensity profile may be a sinusoidal function of position in the x-direction.

For each pole of the dipole, the intensity as a function of position in y-direction may follow a Gaussian distribution. The intensity distribution of the poles of the dipole may be configured to provide isofocal behaviour in the manner discussed further above in connection with FIG. 5.

Figure 13:
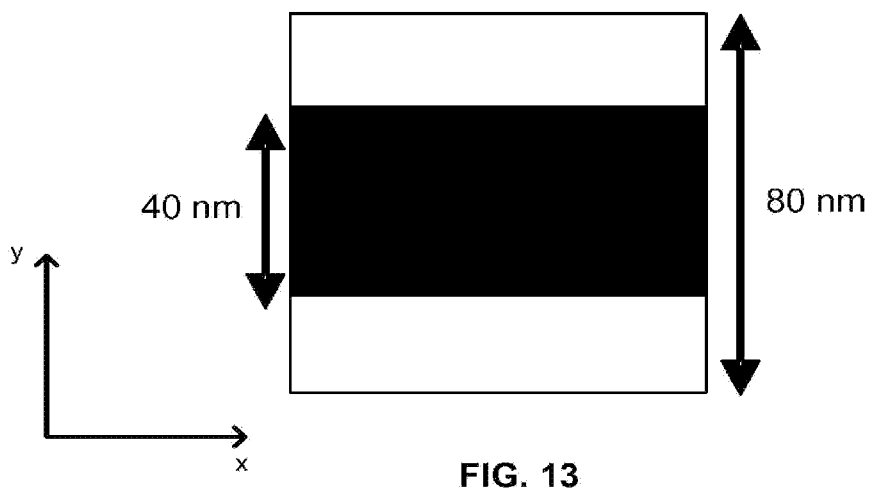
FIG. 13 is a unit of a pattern used by an embodiment of the invention to pattern radiation.

An advantage arising from using a dipole illumination mode instead of a centrally positioned illumination mode of the type depicted in FIG. 5, is that the dipole illumination mode will provide higher contrast of the image formed on the substrate (V). A dipole illumination mode of the type depicted in FIG. 12 may for example be used in connection with a patterning device provided with a grating extending in the y-direction. An example of a repeating unit of such a grating is schematically depicted in FIG. 13. The grating may have a pitch of approximately 80 nm. Each unit of the grating may for example have an opaque portion with a width of approximately 40 nm and a transmissive portion with a width of approximately 40 nm. This grating may be used in combination with a wavelength A of radiation of approximately 193 nm and a projection system with a numerical aperture NA of approximately 1.35.

The patterning device may comprise a conventional (binary) mask (as depicted), an alternating phase shift mask or an attenuating phase shift mask (e.g. with attenuation of around 6%).

In general, the patterning device of any of the embodiments of the invention may comprise a conventional (binary) mask, an alternating phase shift mask or an attenuating phase shift mask (e.g. a 6% attenuating phase shift mask).

In general, the contribution of speckle to a central maximum 13 in an autocorrelation function is approximately inversely proportional to the number N of independent speckle patterns. That is, the contribution of speckle to the central maximum scales with 1/N. The contribution of non-speckle effects to the central maximum is not substantially affected by changes in the number N of independent speckle patterns. The gradient with which the height of the central maximum 13 changes with changes in 1/N is therefore independent of the contribution of non-speckle effects to the central maximum height. Non-speckle effects instead introduce an offset to the height of the central maximum 13 which is independent of 1/N.

A plurality of exposures may be performed using different numbers of pulses in a given exposure period. As was explained above, changing the numbers of pulses in an exposure period will change the number N of independent speckle patterns to which each point on the substrate is exposed. For each number of pulses in the exposure period an autocorrelation function may be derived and the height of a central maximum 13 in the autocorrelation function may be determined. Using this method, changes in the height of the central maximum 13 may be observed at different values of the number N of independent speckle patterns. The gradient with which the height of the central maximum 13 changes with changes in 1/N may be determined from these measurements along with the offset in the height of the central maximum 13 which is caused by non-speckle effects. This allows the contribution of speckle to the height of the central maximum to be separated from the contribution of non-speckle effects to the central maximum. Consequently the speckle central maximum height $H_{CS}$ (and therefore the variance due to speckle) may be determined for each exposure. This method also allows the ratio $R_S$ to be determined by also determining the height of a local maximum in the autocorrelation function which results from each exposure.

Methods have been described above in which the line width and/or dose variance which is caused by speckle. The above described measurements and methods may additionally or alternatively be used to determine the number N of independent speckle patterns to which a given point on a substrate is exposed during an exposure period. As was explained above a determination of the ration $R_S$ allows a standard deviation σ which is caused by speckle to be derived. The number N of independent speckle patterns to which a given point on a substrate is exposed may be derived from the standard deviation σ by rearranging equation (1) to give equation (4) below.

$$N = \left(\frac{1}{\sigma}\right)^2 \quad (4)$$

As was described above a parameter which is indicative of the contribution of speckle may be obtained from one or more exposures performed using a single illumination mode. The parameter which is determined using a single illumination mode may be independent of the illumination mode which is used. For example, a dose variation which is caused by speckle may be determined using a single illumination mode. The dose variation may be independent of the illumination mode which is used to determine the dose variation. Additionally or alternatively the number N of independent speckle patterns to which a given point on a substrate is exposed may be determined. In some embodiments only a single illumination mode with a single number K of periods in the illumination pupil may be used in order to determine the contribution of speckle. This measure may then be applicable to all illumination modes.

In general any number K of periods in the illumination pupil may be selected in order to perform a measurement process to determine the contribution of speckle. It can be seen from equation (2) that increasing the number K of periods in the illumination pupil will lead to an increase in the period $P_s$ in the image plane at which the speckle has an effect. In order to determine the contribution of speckle it may be desirable to measure the line width $W_L$ over a given number of speckle periods $P_s$ in the image plane. Increasing the speckle period $P_s$ will lead to an increase in the length along a line feature, which a given number of speckle periods $P_s$ occupies. Increasing the speckle period $P_s$ may therefore lead to an increase in the length of the line width $W_L$ series which is measured in order to determine the contribution of speckle.

As was described above, in some embodiments a line width series may be determined by taking an image of an exposed line feature using a scanning electron microscope. A scanning electron microscope may have a limited field of view. If the length of a line width $W_L$ series is greater than the field of view of a scanning electron microscope then multiple images may be taken along the length of the line feature and the images may be stitched together in order to determine the full line width $W_L$ series. Stitching together of images may introduce an error into the determination of the line width $W_L$ series and may therefore reduce the accuracy with which the line width $W_L$ series is determined. In some embodiments it may be desirable to use an illumination mode which has a sufficiently small number K of periods that a given number of speckle periods $P_s$ on the substrate W fit into a single field of view of a scanning electron microscope. This may avoid the need to stitch several scanning electron microscope images together in order to determine a full line width $W_L$ series.

Determining the contribution of speckle to a variation in a lithographic process (e.g. a dose variation or line width variation) as was described above may advantageously allow a lithographic process to be optimised whilst accounting for the contribution of speckle. For example, with knowledge of the contribution of speckle, other aspects of a lithographic process may be designed in order to account for contribution of speckle. In some embodiments post-processing steps may be used in order to reduce line width roughness after a substrate is exposed and developed.

In some embodiments if the contribution of speckle is found to be too high (for example it is determined that the contribution of speckle exceeds a threshold), then actions may be taken in order to reduce the contribution of speckle. For example, one or more properties of the radiation source SO may be changed in order to increase the number N of independent speckle patterns which occur during an exposure period. One way in which the number N of independent speckle patterns may be increased is to increase the number of laser pulses which occur during a single exposure period. Increasing the number of laser pulses which occur during a single exposure period may, however, decrease the throughput of a lithographic apparatus (the number of substrates which are exposed per unit of time).

Additionally and/or alternatively the pulse duration of pulses of the radiation beam emitted from the radiation source SO may be increased. For example, one or more pulse stretchers configured to increase the duration of a pulse of radiation may added to the optical path of the radiation beam (e.g. between the radiation source SO and the illumination system IL).

Additionally or alternatively the number N of independent speckle patterns which are seen during an exposure period may be increased by increasing the bandwidth of radiation which is emitted from the radiation source SO. In embodiments in which the radiation source SO comprises a laser, increasing the bandwidth of radiation which is emitted from the radiation source SO will increase the number of active independent laser modes and therefore the number of independent speckle patterns.

Apparatus and methods have been described above which allow the contribution of speckle to a variation in a lithographic feature to be determined. Such a determination may be advantageously used to monitor a change in the speckle contribution which results from a change in a property of a lithographic process. For example, one or more properties of the radiation beam which is emitted from the radiation source SO may be altered and the resulting change in the speckle contribution measured. For example, the bandwidth of the radiation beam which is emitted from the radiation source SO and the corresponding change in the speckle contribution may be measured.

It has been shown through experimentation that decreasing the bandwidth of the radiation beam which is emitted from the radiation source SO causes an increase in the speckle contribution to line width roughness. Determining the change in speckle which is caused by a change in bandwidth advantageously allows the benefits of changing the bandwidth to be assessed and allows a suitable bandwidth to be selected which produces a desired results.

Figure 14:
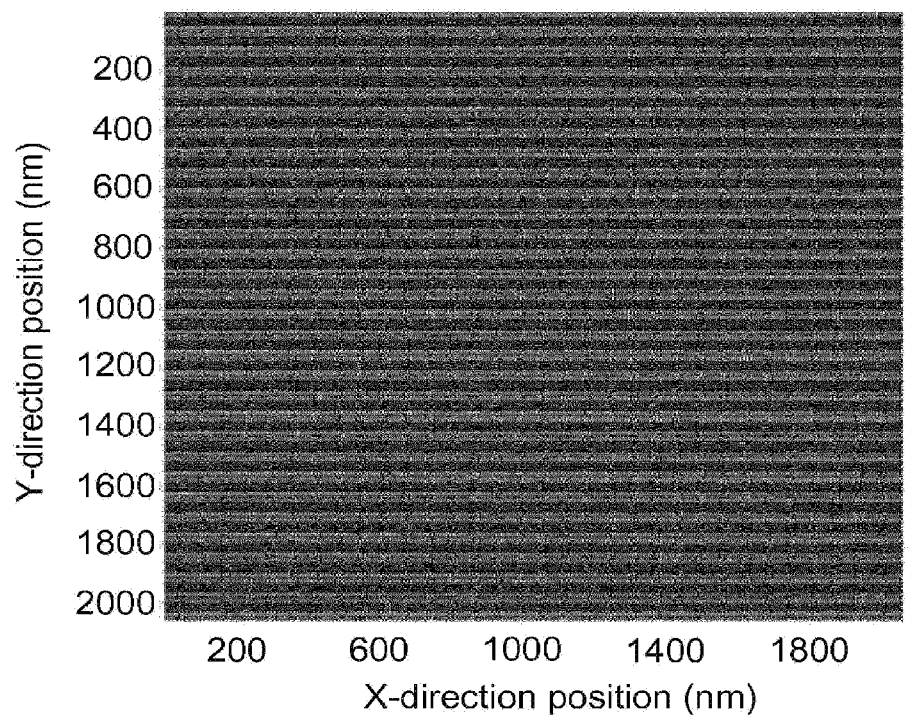
FIG. 14 is an image of lines formed using the illumination mode and pattern of FIGS. 12 and 13.

FIG. 14 is a photograph showing lines of a grating which have been imaged onto a substrate using a lithographic apparatus. The radiation had a wavelength of 193 nm and was x-polarized. The mask was an alternating phase shift mask provided with a grating having a pitch of approximately 160 nm. The numerical aperture of the lithographic apparatus was 1.35. The illumination mode was a single on axis pole with an x-direction modulation of 700 nm with 7 periods (K=7). The photograph was generated using a scanning electron microscope. As may be seen, the grating extends in the y-direction (i.e. it is periodic in the y-direction), with individual lines of the grating extending in the x-direction. As has been explained above, the width $W_L$ of each line may be measured as a function of x-direction position. The resulting width data for each line may then be correlated with itself (i.e. the width of each line is correlated with itself along the x-direction length). This provides an autocorrelation function which can be used to determine how much line width variation (equivalent to critical dimension variation) is caused by speckle. As is explained above, using the autocorrelation function to obtain a generally applicable measure of the contribution of speckle (i.e. independent of illumination mode) may include measuring the intensity profile of the illumination pupil or generating a simulation of this. The following is a description of an alternative method which may be simpler and easier to implement than previously described methods.

Instead of performing a one dimensional autocorrelation along each line in the x-direction, a two dimensional correlation is performed. Referring to FIG. 14, the autocorrelation of the width $W_L$ of each line along the x-direction is performed. The x-direction correlation of the width $W_L$ of each line relative to the next adjacent line is performed. The x-direction correlation of the width $W_L$ of each line relative to the line which is not adjacent but is the next line after the adjacent line is performed (i.e. lines which are separated by an intermediate line are correlated). The x-direction correlation of the width $W_L$ of each line relative to lines which are separated by two intermediate lines is performed. Further x-direction correlations of line widths $W_L$ for greater separations between lines are also performed.

As has been explained further above, the width of imaged lines varies as a function of x-direction position, with part of the width variation being caused by speckle. The width variation is caused by variation of the intensity of radiation which forms the lines, part of this intensity variation being caused by speckle. The standard deviation σ of the line width (which may be referred to as critical dimension standard deviation) therefore depends in part on speckle.

It has been found that the y-direction position of lines also includes some variation which includes a contribution caused by speckle. The y-direction position of the lines is affected by the gradient of intensity change at edges of the lines (i.e. the rate at which the intensity changes from high intensity to low intensity). The gradient of intensity changes is affected by speckle. Consequently, the standard deviation σ of the line position dY depends in part upon speckle.

Figure 15:
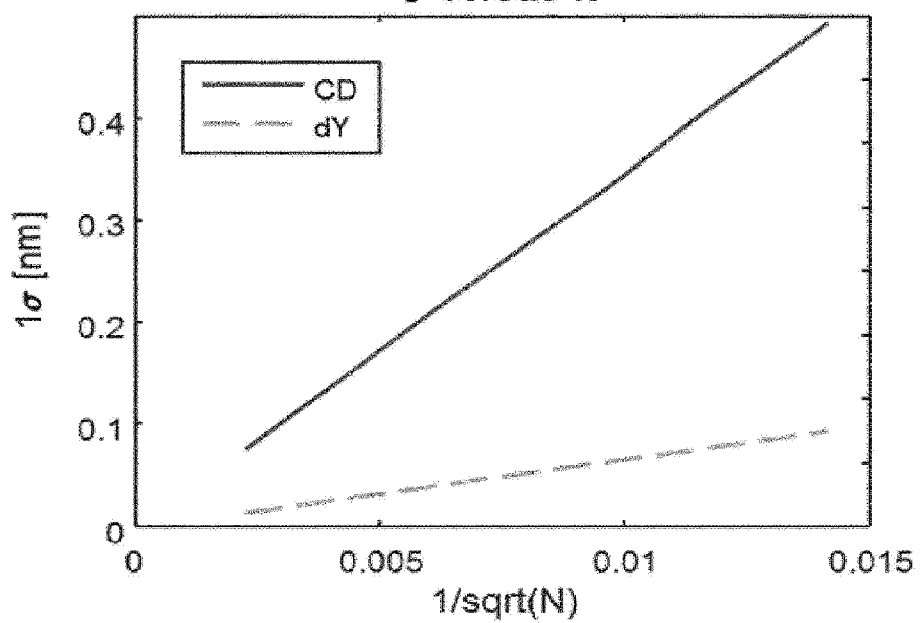
FIG. 15 is a graph obtained using a simulation which depicts standard deviation of critical dimension and line position variation as a function of 1/sqrt(number of independent speckle modes)

FIG. 15 is a graph generated using a simulation. The simulation used the same parameters as the experimental setup used to generate the image in FIG. 14. That is, x-polarized radiation with a wavelength of 193 nm, alternating phase shift mask with a grating having a pitch of 160 nm, and lithographic apparatus numerical aperture of 1.35. A single on axis pole with an x-direction modulation of 700 nm with 7 periods (K=7) was used. The simulation was a Monte Carlo simulation using a radiation E-field having an amplitude of 1 and random phase (distributed between −180 degrees and +180 degrees), run many hundreds of thousands of times, using a simulated lithographic apparatus projection system.

As may be seen from FIG. 15, the standard deviation σ of the critical dimension CD of lines varies linearly as a function of 1/sqrt(N). As noted further above, a measure of the contribution of speckle which is independent of the illumination mode which is used comprises the number N of independent speckle patterns to which a given point on a substrate is exposed during a single exposure period. When the source SO is a laser, the number of independent speckle patterns N is equal to the number of active independent laser modes which are excited in the laser during an exposure period. Thus, the linear variation of line critical dimension standard deviation as a function of 1/sqrt(N) confirms the relationship between the line critical dimension and speckle.

As may also be seen from FIG. 15, the standard deviation σ of the y-direction position dY of the lines also varies linearly as a function of 1/sqrt(N). Thus, the y-direction position dY of lines has the same dependency upon speckle as the line critical dimension. Although the effect of speckle upon the y-direction position dY is less strong than the effect of speckle upon the critical dimension CD, because it is linear with respect to 1/sqrt(N) it can nevertheless be used to assist in speckle determination. The effect is smaller for line position variation dY than it is for CD variation because the gradient of intensity change is relatively small compared with intensity variation.

Figure 16:
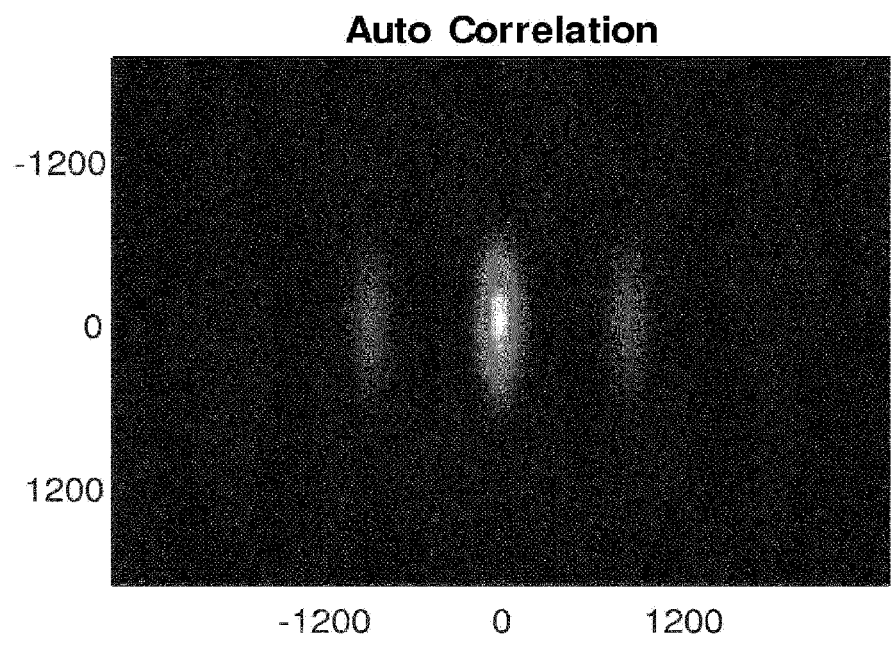
FIG. 16 is an image depicting a two-dimensional correlation of critical dimension obtained from a simulation using the illumination mode and pattern of FIGS. 12 and 13.

FIG. 16 depicts a two dimensional correlation function generated using the simulation. The correlation function is expressed in $nm^2$ as a function of positional offset along the lines (in microns). As may be seen, the correlation function includes a central maximum and first and second local maxima which are spaced apart from the central maximum. As has been explained further above, the first and second local maxima are caused by speckle in combination with the periodic modulation of the illumination mode. Along the y-direction, which corresponds with y-direction separation of lines, these maxima decay as the y-direction separation increases. The zero position of dY corresponds with correlation of each line with itself, and as would be expected provides the highest maxima. Either side of the zero position the correlation function is a correlation of the line width of each line with respect to adjacent lines. Either side of this the correlation function is a combination of the line width of each line with respect to second adjacent lines (i.e. lines separated by an intermediate line), and so on. As the separation (in terms of numbers of lines) between correlated lines increases, the maxima of the two dimensional correlation function reduce in height.

Figure 17:
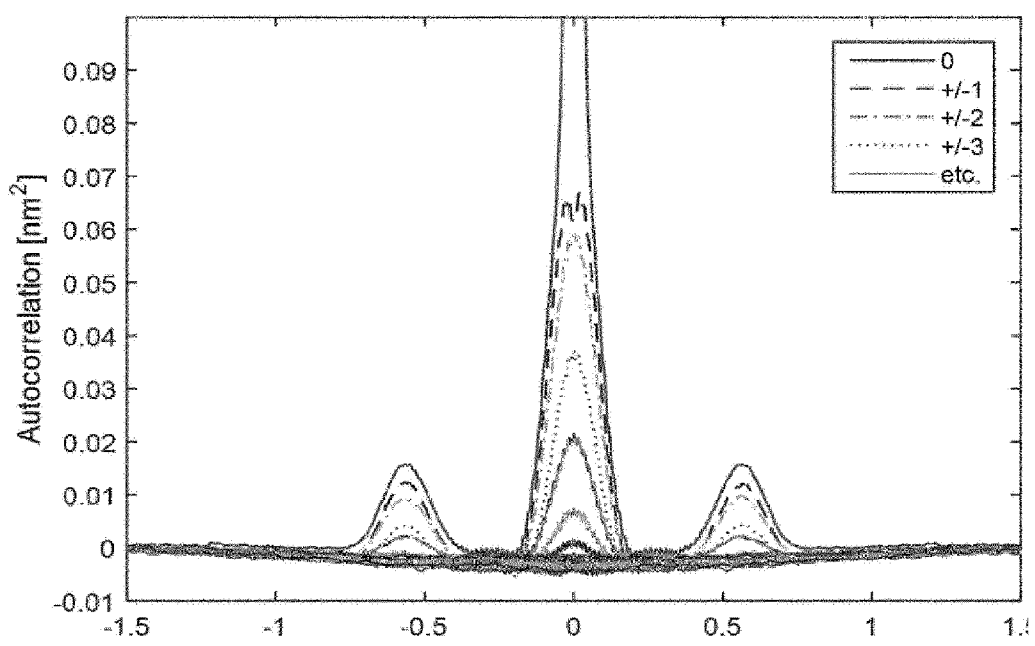
FIG. 17 is a graph which depicts the measurement results of a two-dimensional correlation between lines of the image of FIG. 14.

FIG. 17 depicts experimental results obtained using the photograph depicted in FIG. 14. The results are shown for the correlation of each line with itself, the correlation of each line with adjacent lines, the correlation of each line with second adjacent lines, etc. As may be seen, the top of the central maximum of the autocorrelation function is not visible when each line is correlated with itself. However, the top of the central maximum of the autocorrelation function is visible when adjacent lines are correlated. Similarly, the top of the central maximum is visible when second adjacent lines are correlated. As the separation between correlated lines increases the height of the central maximum reduces.

In other words, the greater the separation between lines which are correlated with each other, the smaller the auto-correlation function maxima become.

The data depicted in FIG. 17 can be used to determine the effect of speckle. First, a background level is determined by looking at data obtained with lines that are widely separated from each other (e.g. separated by 7 intermediate lines or more), and this is subtracted from the data obtained for other lines. Then, the ratio $R_S$ between the height of the local maxima $H_{LS}$ and the height of the central maximum $H_{CS}$ is determined for different line separations. The average of this ratio is then determined. The average ratio $R_S$ is then used, in combination with the speckle local maximum height $H_{LS}$ for lines which are correlated with themselves, to estimate the height of the central maximum $H_{CS}$ caused by speckle for lines which are correlated with themselves. This determines the CD variance of the lines of the image which is caused by speckle (in other words the speckle contribution to the central maximum).

The CD variance due to speckle (as measured in $nm^2$) may be converted to dose variation and thereby used to determine the number of independent speckle patterns N of the radiation source. This may be done by using experimental data which links the variation of feature size (e.g. line width) to the dose of radiation delivered to the substrate. The experimental data may be generated using a so called focus exposure matrix, in which a grating is exposed on a substrate using different doses of radiation and using different positions relative to the focal plane, and the widths of lines of the imaged grating are measured. The relationship between line width and dose is applied to the CD variance caused by speckle to convert it to dose variance caused by speckle (which may equivalently be referred to as intensity variance). This can then be converted using equation (1) to a measurement of the number of independent speckle patterns N of the radiation source (the number of independent laser modes if the source is a laser). Although an embodiment which uses particular parameters such as specific mask grating dimensions has been described, it will be appreciated that other embodiments may be used. In general, a pattern comprising a grating which will form an image of lines on a substrate may be used. The pattern may be used in combination with a modulated illumination mode. The width variation of lines as correlated with themselves and as correlated with other lines may be analysed to determine speckle.

In an embodiment, the positional variation of the lines dY may be used to determine speckle. This may be done by correlating the positional variation of the lines dY for each line, each adjacent line, lines separated from each other by an intermediate line, etc. The results of this two-dimensional correlation may then be used, in combination with a simulation of the effect of speckle on line position variation, to determine speckle (in a manner analogous to that described above for other embodiments).

Figure 18:
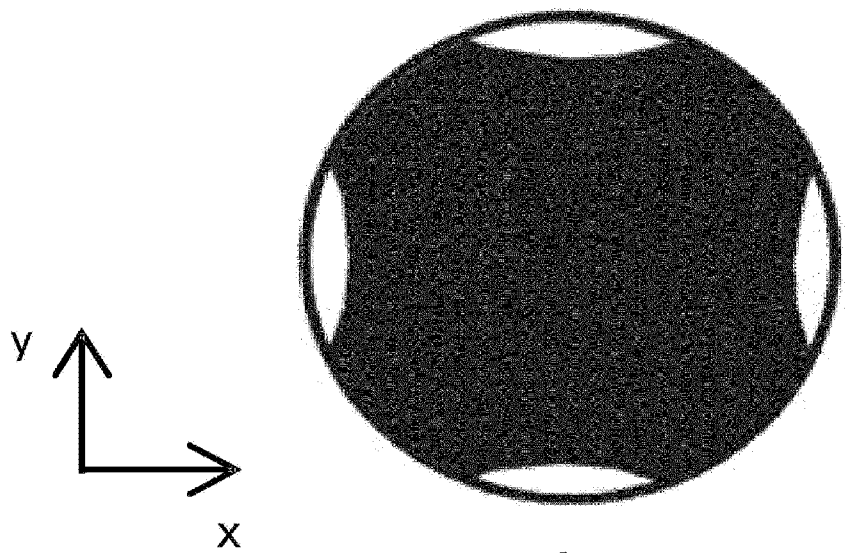
FIG. 18 is an illumination mode used by an embodiment of the invention.

FIG. 18 schematically depicts an illumination mode which may be used by a further alternative embodiment of the invention. The illumination mode is a quadrupole mode, with poles at x-direction edges and y-direction edges of the illumination pupil. Unlike illumination modes of previously depicted embodiments, each pole of the illumination mode of FIG. 18 does not include a modulation. However, the illumination mode as a whole effectively includes some modulation due to the spatial separation between opposite poles of the mode.

Figure 19:
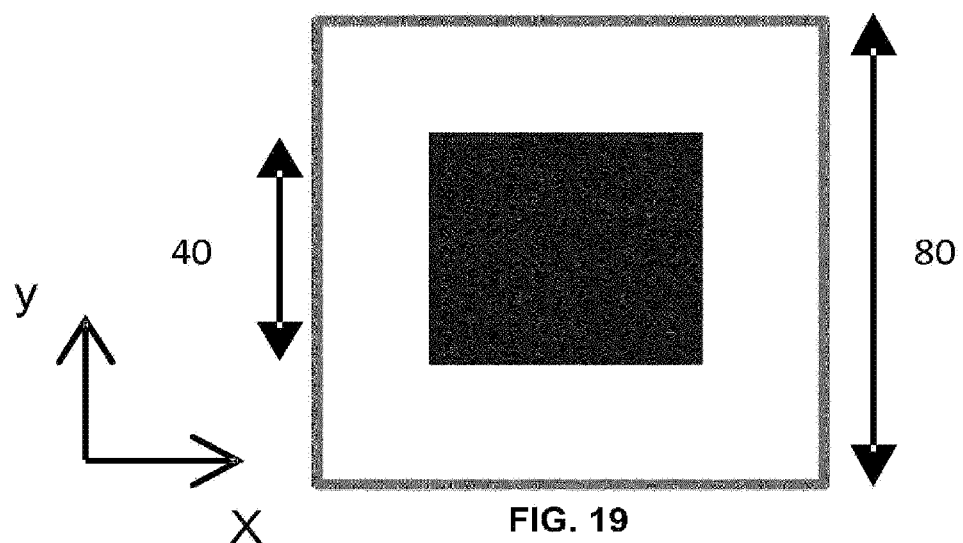
FIG. 19 is a unit of a pattern used by an embodiment of the invention to pattern radiation.

FIG. 19 depicts schematically one repeating unit of a pattern provided on a patterning device which may be used in combination with the illumination mode of FIG. 18 to enable measurement of speckle. The pattern comprises a two dimensional grid of squares. The squares may for example be opaque (e.g. formed from chromium) with transparent areas being provided between the squares. In one example, as depicted, each square may measure 40 µm×40 µm, and each square may be separated from adjacent squares in the x and y directions by a gap of 40 µm. Thus, a repeating unit which measures 80 µm×80 µm is provided (as depicted). The illumination mode and the pattern may for example be used for a radiation source with a wavelength of 193 nm and a projection system with a numerical aperture of 1.35. In other embodiments the pattern may comprise a two dimensional grid with other dimensions. The pattern may be formed using a binary (conventional) mask, a phase shift mask, or an attenuating phase shift mask.

The pattern on the patterning device generates a grid (or two dimensional array) of features on the substrate. The features may be referred to as holes. The holes may be photographed using a scanning electron microscope and properties of the holes may then be analysed.

The quadrupole illumination mode generates a diffraction pattern which is in the form of a two dimensional array of features. The orientation and pitch of the features of the two dimensional array is determined by the quadrupole illumination mode. The orientation may be selected to correspond with the x and y directions by separating the poles in the x and y directions (as depicted). The pitch of the features is determined by Braggs' law, and depends upon the wavelength of the radiation and the distance between opposite poles. In this embodiment the wavelength is 193 nm and the separation between the poles is 193/80=2.41. Thus the features are optimally imaged with a relative pole position of: 193/(80×2×1.35)=0.89 (from a central point of the pupil) and a relative pole separation from each other of 1.78.

The image formed on the substrate is a combination of a pattern generated by the mask pattern and diffraction features generated by the quadrupole illumination mode. Variation of the size of the imaged holes, which corresponds with critical dimension variation, may be measured. Variation of the relative positions in the x-direction (dX) and the y-direction (dY) of the imaged holes may also be measured. The results of these measurements may be used to determine the effect of speckle. This is because speckle shows up as a correlation between properties of neighbouring holes.

Figure 20:
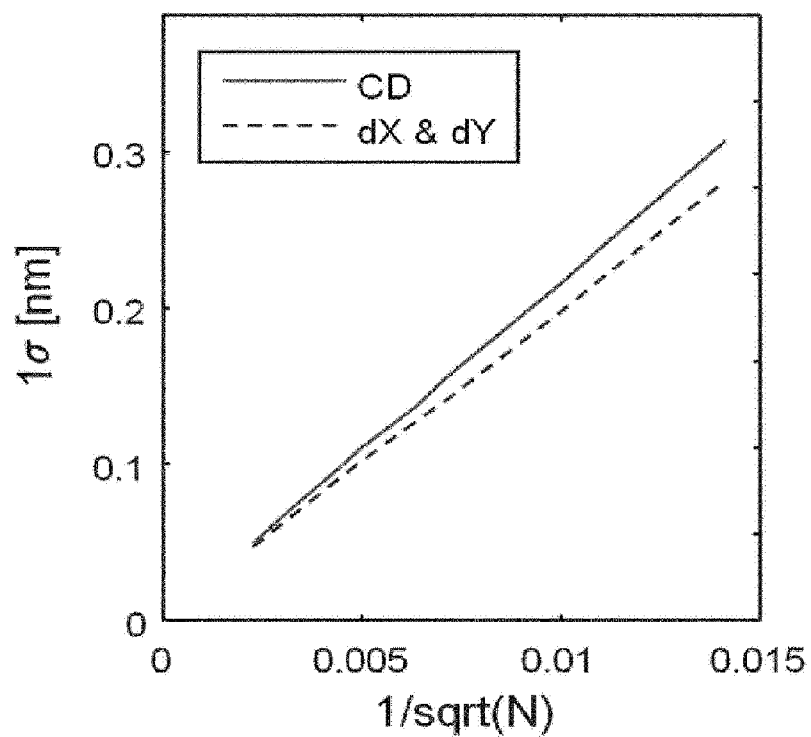
FIG. 20 is a graph obtained using a simulation which depicts standard deviation of critical dimension and feature position variation as a function of 1/sqrt(number of independent speckle modes)

FIG. 20 shows the results of a simulation in which a patterning device provided with a grid of squares as depicted in FIG. 19 was illuminated using a quadrupole mode as depicted in FIG. 18. The wavelength of radiation was 193 nm, TE polarised and the numerical aperture of the lithographic apparatus was 1.35. The simulation was a Monte-Carlo simulation using a radiation E-field having an amplitude of 1 and random phase (distributed between −180 degrees and +180 degrees), run many hundreds of thousands of times As may be seen from FIG. 20, the standard deviation σ of the critical dimension CD of holes varies linearly as a function of 1/sqrt(N). This linear variation as a function of 1/sqrt(N) confirms the relationship between the hole critical dimension and speckle.

As may also be seen from FIG. 20, the standard deviation σ of the x-direction position dX of the holes varies linearly as a function of 1/sqrt(N). Thus, the x-direction position dX of holes has same dependency upon speckle as the line critical dimension, i.e. it is linear as a function of 1/sqrt(N). The effect of speckle upon the x-direction position dX is very similar in magnitude to the effect upon the critical dimension CD. From a comparison with FIG. 15 it may be seen that the variation of the standard deviation of hole position as a function of 1/sqrt(N) is significantly greater than the position variation seen with grating lines. This is because the gradient of intensity change for features of the grid is steeper than the gradient of intensity change for the grating lines.

As may also be seen from FIG. 20, the standard deviation σ of the y-direction position dY of the holes also varies linearly as a function of 1/sqrt(N). The effect of speckle upon the y-direction position dY is very similar in magnitude to the effect upon the critical dimension CD and the effect upon the x-direction position dX.

The total variance of the critical dimension of holes is affected by speckle and by various other factors. However, correlation between the critical dimensions of neighbouring holes is only affected by speckle and is not affected by other properties of the radiation. Similarly, x-direction position variation and y-direction position variation between neighbouring holes is only affected by speckle and is not affected by other properties of the radiation.

Using the results of the simulation, the two dimensional auto correlation of the critical dimension of the holes may be determined. In other words, an autocorrelation of hole size is determined for the grid of holes, to obtain an autocorrelation function. A correlation of hole size for the grid of holes with respect to immediately adjacent holes in the x-direction is also determined. A correlation of hole size for the grid of holes with respect to holes separated in the x-direction by an intermediate hole is determined. A correlation of hole size for the grid of holes with respect to holes separated in the x-direction by two intermediate holes is determined, etc. Corresponding correlations are determined in the y-direction. Correlations are also performed for combinations of x-direction and y-direction separations between holes.

Figure 21:
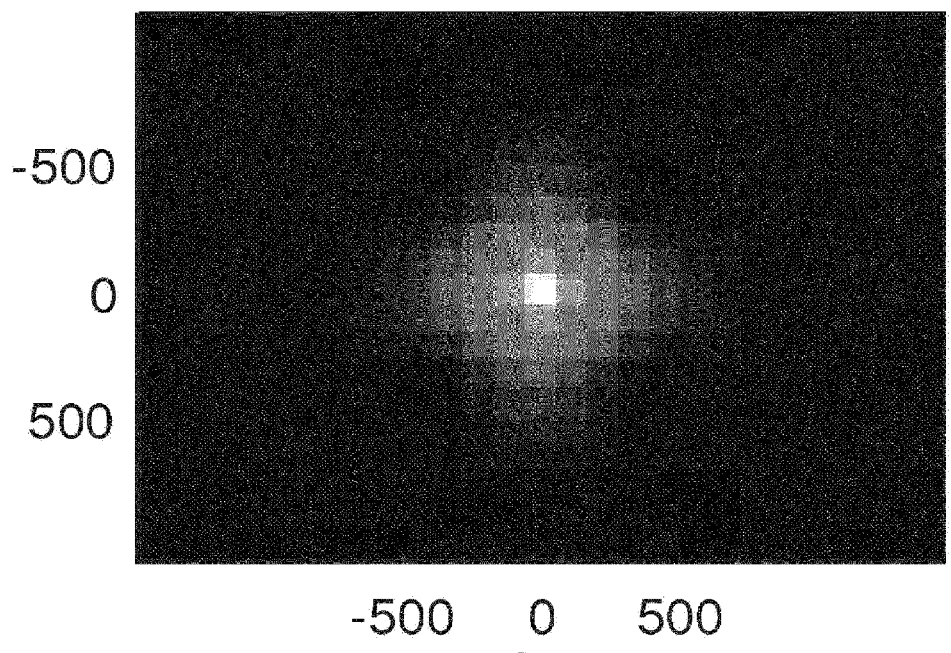
FIG. 21 is an image depicting a two-dimensional correlation of critical dimension obtained from a simulation using the illumination mode and pattern of FIGS. 18 and 19.

FIG. 21 depicts the results of the simulation referred to above. The two dimensional correlation of hole size in a simulated image was generated as a function of x-direction and y-direction separation by determining the size of all of the holes in the x and y directions and then correlating these as a function of hole separation from each other.

In FIG. 21, the central maximum is a correlation of the size of each hole with itself (an autocorrelation). The size of this maximum indicates the total variance of critical dimension caused by speckle (other causes of critical dimension variation which are seen in practice when images are actually formed using a lithographic apparatus not present in the simulation). Either side of the central maximum, the correlation of critical dimension for neighbouring holes is also determined solely by speckle. The relative size of the critical dimension variance at the central maximum and the critical dimension variance either size of the central maximum is determined using the data generated by the simulation.

A lithographic apparatus is used to project the mask pattern of FIG. 19 onto a substrate using radiation with the illumination mode depicted in FIG. 18. The radiation has properties as described above for the simulation: wavelength 193 nm, etc. A two dimensional correlation of hole size in the resulting image is generated as a function of x-direction and y-direction position by determining the size of all of the holes in the x and y directions and then correlating these as a function of hole position relative to each other. The central maximum obtained using the two dimensional correlation indicates the total variance of critical dimension, including variance caused by speckle and variance due to other causes. Either side of the central maximum, the critical dimension variance for neighbouring holes is determined solely by speckle (or almost exclusively by speckle). This is because the separation between holes is sufficiently large that other effects, which have short correlation lengths, do not extend to adjacent holes (or the effects are very small at adjacent holes).

Using the simulation, the relative size (ratio) of the critical dimension variance at the central maximum and the critical dimension variance either size of the central maximum has been determined. The size of the critical dimension variance either side of central maximum in an image exposed by the lithographic apparatus has been measured. Knowing the ratio, and knowing the size of the critical dimension variance either side of the maximum for the exposed image, allows the size of the central maximum caused solely by speckle to be determined. In other words, the critical dimension variance of the holes caused solely by speckle is determined.

The critical dimension variance of the holes caused by speckle is determined in $nm^2$. This can be converted to dose variation caused by speckle, and converted to the number of independent speckle patterns N of the radiation source in the manner explained above in connection with the previous embodiment.

Figure 22:
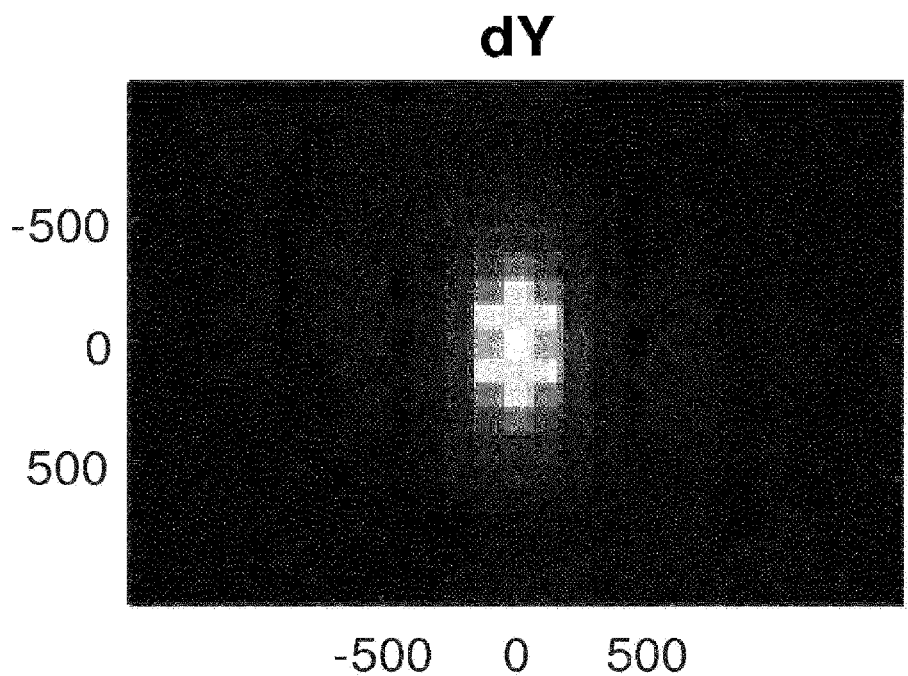
FIG. 22 is an image depicting a two-dimensional correlation of y-direction position variation of features obtained from a simulation using the illumination mode and pattern of FIGS. 18 and 19.
Figure 23:
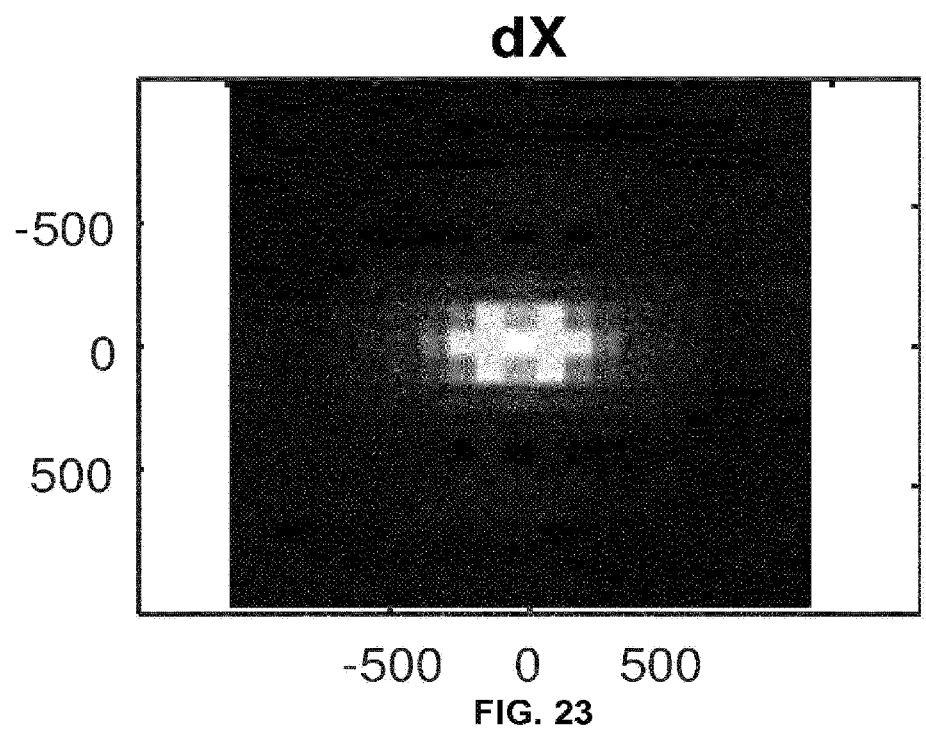
FIG. 23 is an image depicting a two-dimensional correlation of x-direction position variation of features obtained from a simulation using the illumination mode and pattern of FIGS. 18 and 19.

FIGS. 22 and 23 depict the results of the same simulation, but this time displaying data indicating variation of y-direction position dY of the holes as a function of the separation between the holes (FIG. 22), and variation of the x-direction position dX as a function of the separation of the holes (FIG. 23). The data obtained from the simulation may be used together with an image formed using a lithographic apparatus to determine speckle in the same manner as described above in connection with critical dimension variation.

Although an embodiment which uses particular parameters such as pattern feature size has been described, it will be appreciated that other embodiments may be used. In general, a pattern comprising a two-dimensional array of pattern features which will form a two dimensional array of image features on a substrate may be used. The pattern may be used in combination with an illumination mode which will generate a two-dimensional diffraction pattern comprising an array of features. The features of the two-dimensional diffraction pattern may have the same pitch and orientation as the imaged pattern features. The critical dimension variation of features as correlated with themselves and as correlated with other features may be analysed to determine speckle. The positional variation of features as correlated with themselves and as correlated with other features may be analysed to determine speckle.

Specific embodiments of methods and apparatus for measuring the contribution of speckle have been described above with reference to the figures. However, other embodiments of the invention may be different to the specific details described above. Whilst embodiments of the invention have been described above with reference to a lithographic apparatus LA, the invention may be used to determine the contribution of speckle in any optical system comprising an illumination system configured to illuminate a patterning device and a projection system configured to project a patterned radiation beam onto an image plane.

Figure 24:
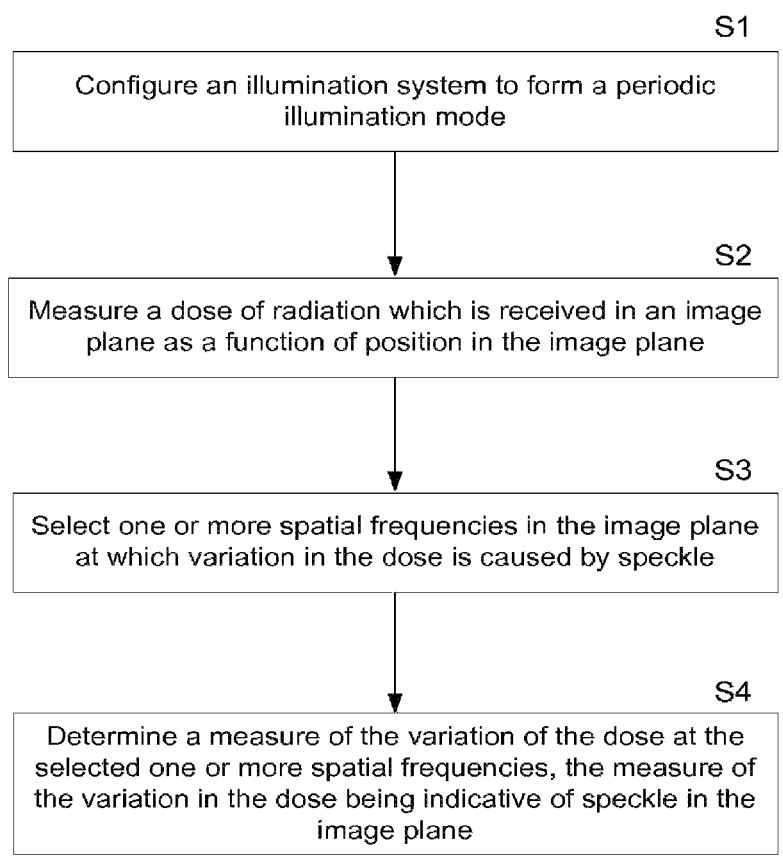
FIG. 24 is a representation of steps of a method according to an embodiment of the invention.

FIG. 24 is a flowchart which outlines the steps of a general method for measuring the effects of speckle in an optical system according an embodiment. At step S1 an illumination system is configured to form a periodic illumination mode. The periodic illumination mode comprises a spatial intensity profile in a pupil plane of the illumination system which is periodic in at least one direction. For example, the intensity of radiation in the pupil plane may be substantially sinusoidal (e.g a cosine function such as 1+cos(x)) as a function of position in at least one direction (e.g. an x-direction) in the pupil plane.

The spatial intensity profile in the pupil plane may not be periodic in some directions. For example, the spatial intensity profile may be periodic in an x-direction but may not be periodic in a y-direction. The spatial intensity profile may for example follow a Gaussian distribution in the y-direction.

The periodic spatial intensity profile may include K periods in the pupil plane. K may be an integer. K may be an odd number. K may be greater than 2. K may for example be 5 or more. In some embodiments K may about 17 or less.

The illumination mode illuminates a patterning device in an optical system. The patterning device imparts the radiation with a pattern, thereby forming a patterned radiation beam. The spatial intensity profile of radiation in the pupil plane determines the angular intensity profile of radiation which illuminates the patterning device. The periodic spatial intensity profile in the pupil plane will therefore cause the patterning device to be illuminated with a periodic angular intensity profile.

At step S2 a dose of radiation which is received in an image plane of the optical system as a function of position in the image plane is measured. The patterned radiation beam is projected onto the image plane by a projection system. The patterned radiation beam may, for example, include one or more line features (i.e. a line of radiation). The received dose of radiation may be measured directly or may be measured indirectly. For example, a substrate may be positioned in the image plane and may be exposed to the patterned radiation beam. One or more features of the patterned radiation beam may be transferred to the substrate by exposure of the substrate to the one or more features. For example, a resist may be provided on the substrate. Exposure of the resist to the features of the patterned radiation beam may cause a state change in the exposed portion of the resist. The resist may be developed, for example, using an etching process so as to form one or more features of the patterned radiation beam in the resist. The developed resist may form a mask for etching the feature into the substrate so as to transfer the feature into the substrate.

In embodiments in which the feature of the patterned radiation beam is transferred to a substrate. The dose of radiation which is received in the image plane may be indirectly measured by measuring a dimension of one or more features in the substrate. For example, the width of a feature in the substrate may be approximately proportional to the dose of radiation which is received at that location in the image plane. Measuring the width of the feature as a function of position on the substrate may therefore allow the dose of radiation which is received in the image plane as a function of position in the image plane to be determined.

A dimension of one or more features in a substrate may, for example, be measured using a scanning electron microscope. The scanning electron microscope may be used to form an image of a feature which is patterned into the substrate. A dimension of the feature may be measured by performing image analysis on an image of the feature which is patterned into the substrate. For example, one or more edges of the feature may be detected in the image so as to determine the positions of the edges of the feature (e.g. the edges of a line feature). The positions of the edges of the feature may be used to determine a dimension of the feature. For example, the width of a feature may be determined at different positions in the feature. In some embodiments the width of a line feature may be determined at different positions along the length of the line. The measured width of the feature as a function of position on the substrate may allow the dose of radiation which is received in the image plane as a function of position in the image plane to be determined In some embodiments a plurality of features may be exposed and a dimension of the plurality of features may be measured. For example, in some embodiments more than about 100 line features may be exposed and the line width of each feature may be measured thereby providing more than about 100 line width series for a given illumination mode. In some embodiments more than about 1000 line features may be exposed in order to provide more than about 1000 line width series for a given illumination mode. A plurality of line width series for a given illumination mode may be used to calculate an average power spectral density at a plurality of spatial frequencies for the given illumination mode.

Apparatus configured to measure a dose of radiation which is received in the image plane as a function of position on the image plane may be considered to be a measurement system. A measurement system may comprise a substrate table configured to hold a substrate in the image plane of the projection system so as to receive the patterned radiation beam. The substrate may be provided with a resist. The measurement system may further comprise apparatus configured to develop the resist and transfer the pattern to the substrate as was described above. Apparatus which is configured to apply a resist to a substrate and to develop the resist may be referred to as a track.

The measurement system may further comprise a sensor configured to detect the dimension of a feature in the substrate at different positions on the substrate. For example, the measurement system may comprise a sensor (e.g. a scanning electron microscope) configured to form an image of the feature in the substrate. The measurement system may further comprise apparatus (e.g. a controller) configured to determine a dimension of the feature in the substrate. For example a controller may process an image to detect the position of one or more edges of the feature (e.g. the edges of a line feature) and may determine a dimension of the feature from the detected positions of the edges. The controller may be further configured to determine a dose of radiation which is received in the image plane from the determined dimension of the feature.

Exposing features on a substrate and measuring a dimension of the exposed features in order to determine a dose of radiation is merely one example of a method for determining a received dose of radiation in an image plane as a function of position in the image plane. In other embodiments, other methods for measuring a received dose of radiation may be used. In some embodiments, radiation which is received in an image plane may be measured directly, for example, using a sensor positioned substantially in the image plane. The sensor may measure the spatial intensity profile of radiation in the image plane at different positions in the image plane.

Due to the small size of features of the spatial intensity profile in the image plane, in some embodiments, a magnified image of the spatial intensity profile in the image plane may be formed in a further image plane. A sensor may be positioned substantially in the further image plane and may be configured to measure the magnified image of the spatial intensity profile in the image plane. The sensor may, for example, comprise a camera.

Apparatus configured to measure a spatial intensity profile of radiation in an image plane may be considered to be an example of a measurement system. For example, a measurement system may comprise a sensor configured to measure the spatial intensity profile of radiation in the image plane at different positions in the image plane. In some embodiments a measurement system may comprise one or more optical elements configured to form a magnified image of the image plane in a further image plane. The sensor may be positioned substantially in the further image plane. The measurement system may further comprise a controller configured to determine a received dose of radiation at different positions in the image plane.

At step S3 one or more spatial frequencies in the image plane are selected at which a variation in the dose is caused by speckle. The one or more spatial frequencies at which speckle causes a variation in the dose depends on the period of the periodic intensity profile in the pupil plane of the illumination system. The period of the periodic intensity profile in the pupil plane of the illumination system (or equivalently the number of periods K in the pupil plane) may be used to select the one or more frequencies. For example equation (2) above may be used to select the one or more frequencies.

At step S4 a measure of the variation of the dose at the selected one or more spatial frequencies is determined. The measure of the variation in the dose is indicative of speckle in the image plane. The measure may, for example, comprise an autocorrelation function of a first series and a second series. The first series may be a measured dimension of a feature of the patterned radiation beam at different positions in the image plane. The second series may be identical to the first series and the autocorrelation function between the first and second series may be calculated when the second series is offset relative to the first series. The autocorrelation function may be calculated at a positional offset between the second series and the first series which is equal to the inverse of the one of more spatial frequencies selected in step S3. That is the positional offset may be equal to the spatial period at which variation in the measured dimension is caused by speckle. The magnitude of the autocorrelation function at such an offset is an indication of speckle in the image plane.

The spatial frequency which is selected in step S3 may correspond to a positional offset in the autocorrelation function at which a local maximum is seen. The magnitude of the autocorrelation function at a positional offset corresponding to the frequency selected in step S3 may therefore be a height of the autocorrelation function at a local maximum in the autocorrelation function.

The spatial frequency which is selected in step S3 may, for example, be selected by finding a local maximum in the autocorrelation function. The positional offset at which the local maximum is seen may correspond to the spatial frequency which is selected. That is the spatial frequency may be taken to be 1 over the positional offset at which the local maximum is seen.

References which are made herein to a local maximum are intended to refer to regions in which a function (e.g. an autocorrelation function) reaches a local maximum which is not a maximum of the entire function. References to a local maximum are not therefore intended to include a region in which the function is at a global maximum (e.g. a central maximum). References herein to a central maximum in an autocorrelation function are intended to refer to a region of the autocorrelation function at which the autocorrelation function is at a global maximum.

The measure of the variation in the dose may be used to derive a measure of the speckle in the image plane which is independent of the illumination mode which is used. The measure of the variation of the dose may, for example, be used to derive the variance (or equivalently the standard deviation σ) in the measured dose in the image plane which is caused by speckle. In embodiments in which an autocorrelation function is determined using the dimension which is measured in step S2, the variance in the measured dose in the image plane which is caused by speckle corresponds to the contribution of speckle to the height of the autocorrelation function at a global maximum in the autocorrelation function.

In some embodiments the height of the autocorrelation function at a local maximum in the autocorrelation function may be used to derive the contribution of speckle to the height of the autocorrelation function at a global maximum in the autocorrelation function. For example a ratio between the height of a local maximum and the height of a global maximum in an autocorrelation function which represents the contribution of speckle to variation in the measured dose may be determined. The determined ratio may be used to scale the height of a measured autocorrelation function at a local maximum to find the contribution of speckle to the height of a global maximum in the autocorrelation function.

One or more of the steps which are shown in FIG. 24 and which are described above may be carried out by a controller. For example, the controller CN which is shown in FIG. 1 may carry out one or more of the steps shown in FIG. 24 and described above.

A controller CN as described herein may, in some embodiments, comprise a computer. A computer may, for example, include a CPU (central processing unit) which is configured to read and execute instructions stored in a volatile memory which takes the form of a random access memory. The volatile memory stores instructions for execution by the CPU and data used by those instructions.

Embodiments have been described above with reference to a lithographic apparatus LA, which includes an illumination system IL configured to illuminate a patterning device MA so as to form a patterned radiation beam, and a projection system PL configured to project the patterned radiation beam onto an image plane. However, the apparatus and methods described herein are applicable to determining the contribution of speckle in other optical systems which may not be lithographic apparatuses.

As was described above, forming a patterned radiation beam using a patterning device so as to form pattern features in an image plane and then measuring a dimension of the pattern features in the image plane is merely one example of a method for determining a received dose of radiation in an image plane. In other embodiments no patterning device may be used and a received dose of radiation in an image plane may be measured as a function of position in the image plane by other suitable means.

Whilst the embodiments which are described above refer to measuring a received dose of radiation in an image plane (typically the plane in which a substrate is situated), in other embodiments a received dose of radiation may be measured in any plane which is an optical conjugate of an image plane. For example, a received dose of radiation may alternatively be measured in an object plane of an optical system, where the object plane is a conjugate plane of an image plane. An example, of an object plane in a lithographic system may be a plane in which a patterning device MA is typically situated.

Any plane which is optically conjugate to an image plane (e.g. an object plane) may be referred to herein as a field plane. Examples of a field plane therefore include an image plane (e.g. a plane in which a substrate W is typically situated) and an object plane (e.g. a plane in which a patterning device MA is typically situated). In general, the contribution of speckle may be determined using the methods described herein by measuring a dose of radiation which is received in any field plane of the optical system as a function of position in the field plane. The field plane may, for example, be an image plane or an object plane of an optical system. Any reference herein to measuring a dose of radiation in an image plane of an optical system may therefore be equivalently replaced with measuring a dose of radiation in a field plane.

In general the inventive concepts disclosed herein may be used to determine the contribution of speckle in any optical system which comprises an illumination system operable to form a periodic illumination mode in a pupil plane of the optical system. The periodic illumination mode in the pupil plane serves to advantageously confine the effects of speckle to a limited number of spatial frequencies in a field plane of the optical system. This advantageously allows the contribution of speckle to dose variations in the field plane to be separated from the contributions of other effects.

A pupil plane of an optical system is a plane which has a Fourier relationship with a field plane. That is, each spatial point in a pupil plane corresponds with an angle in a corresponding field plane and vice versa.

Aspects of the invention may be implemented in any convenient form. For example, the invention may be implemented by appropriate computer programs which may be carried on appropriate carrier media which may be tangible carrier media (e.g. disks) or intangible carrier media (e.g. communications signals). Aspects of the invention may also be implemented using suitable apparatus which may specifically take the form of programmable computers running computer programs arranged to implement the invention.

While specific embodiments of the invention have been described above, it will be appreciated that the invention may be practiced otherwise than as described. The description is not intended to limit the invention.

The invention claimed is:

1. A method comprising:
   forming a periodic illumination mode of radiation;
   patterning the radiation using a pattern comprising a grating to create patterned radiation;
   projecting the patterned radiation to form an image of the grating;
   measuring line width variation of lines of the imaged grating; and
   performing a two-dimensional correlation of the line widths in which lines are correlated with themselves and are correlated with other lines of the image to enable determination of speckle or a physical characteristic caused by speckle.

2. The method of claim 1, further comprising determining a ratio of a local maximum to a central maximum for one or more lines which were correlated with other lines of the image, and using that ratio together with a local maximum for lines which were correlated with themselves to determine a central maximum caused by speckle for the lines which were correlated with themselves.

3. The method of claim 2, further comprising using a previously performed calibration to convert the size of the central maximum to a measurement of dose variation caused by speckle.

4. A method comprising:
   forming a quadrupole illumination mode of radiation;
   patterning the radiation using a pattern comprising a two-dimensional array of features to create patterned radiation;
   projecting the patterned radiation to form an image having imaged pattern features;
   performing a two-dimensional correlation of critical dimension and/or position of the imaged pattern features as a function of pattern feature separation; and
   determining a size of the correlation function away from a central maximum of the correlation function, and using this together with a previously obtained ratio to determine the size of a central maximum of the correlation function that is caused by speckle.

5. The method of claim 4, further comprising using a previously performed calibration to convert the size of the central maximum to a measurement of dose variation caused by speckle.

6. A method comprising:
   forming a periodic illumination mode of radiation;
   patterning the radiation using a pattern of pattern features to create patterned radiation;
   projecting the patterned radiation to form an image of the pattern including imaged pattern features;
   measuring at least one dimensional aspect of the imaged pattern features; and
   performing a correlation of the measured at least one dimensional aspect to enable determination of speckle or a physical characteristic caused by speckle.

7. The method of claim 6, wherein forming a periodic illumination mode of radiation comprises forming a quadrupole illumination mode of radiation.

8. The method of claim 6, wherein the pattern comprises a grating, the pattern features comprise lines in the grating, and the at least one dimensional aspect comprises line width variation of the lines, and wherein performing a correlation of the measured at least one dimensional aspect comprises performing a two-dimensional correlation of the line widths in which lines are correlated with themselves and are correlated with other lines of the image.

9. The method of claim 8, wherein forming a periodic illumination mode of radiation comprises forming a quadrupole illumination mode of radiation.

10. The method of claim 6, further comprising determining a ratio of a local maximum to a central maximum for one or more lines which were correlated with other lines of the image, and using the ratio together with a local maximum for lines which were correlated with themselves to determine a central maximum caused by speckle for the lines which were correlated with themselves.

11. The method of claim 6, further comprising using a previously performed calibration to convert the size of the central maximum to a measurement of dose variation caused by speckle.

12. The method of claim 6, wherein the pattern comprises a two dimensional array of pattern features and the at least one dimensional aspect comprises pattern feature separation, and wherein performing a correlation of the measured at least one dimensional aspect comprises performing a two-dimensional correlation of a critical dimension of the imaged pattern features as a function of the measured pattern feature separation, and further comprising
   determining a size of the two dimensional away from a central maximum of the correlation, and
   using the size of the two dimensional away from a central maximum of the correlation together with a previously obtained ratio to determine a size of a central maximum of the correlation that is caused by speckle.

13. The method of claim 12, wherein forming a periodic illumination mode of radiation comprises forming a quadrupole illumination mode of radiation.

14. A computer program product comprising a non-transitory computer-readable medium comprising instructions therein, the instructions, upon execution by a computer system, configured to cause the computer system to at least:
obtain measured values of at least one dimensional aspect of imaged pattern features, wherein the imaged pattern features are formed by projection of patterned radiation obtained by patterning radiation having a periodic illumination mode of radiation using a pattern of pattern features; and
perform a correlation of the measured at least one dimensional aspect to enable determination of speckle or a physical characteristic caused by speckle.

15. The computer program product of claim 14, wherein the instructions are further configured to determine a size of the correlation function away from a central maximum of the correlation function, and use this together with a previously obtained ratio to determine the size of a central maximum of the correlation function that is caused by speckle.

16. The computer program product of claim 14, wherein the performance of the correlation comprises performance of a two-dimensional correlation of the measured at least one dimensional aspect of the imaged pattern features in which pattern features are correlated with themselves and are correlated with other pattern features of the imaged pattern features to enable determination of speckle or a physical characteristic caused by speckle.

17. The computer program product of claim 14, wherein the instructions are further configured to cause the computer system to determine a ratio of a local maximum to a central maximum for one or more pattern features which were correlated with other pattern features of the imaged pattern features, and use that ratio together with a local maximum for pattern features which were correlated with themselves to determine a central maximum caused by speckle for the pattern features which were correlated with themselves.

18. The computer program product of claim 14, wherein the pattern of pattern features is a two-dimensional array of features.

19. The computer program product of claim 18, wherein the performance of the correlation comprises performance of a two-dimensional correlation of the measured at least one dimensional aspect of the imaged pattern features as a function of pattern feature separation.

20. The computer program product of claim 14, wherein the pattern of pattern features is a grating.

21. The computer program product of claim 14, wherein the at least one dimension aspect comprises line width variation, critical dimension and/or position.

* * * * *